US009159416B2

(12) United States Patent
Lu et al.

(10) Patent No.: US 9,159,416 B2
(45) Date of Patent: Oct. 13, 2015

(54) SILICON BASED NANOSCALE CROSSBAR MEMORY

(71) Applicant: The Regents of the University of Michigan, Ann Arbor, MI (US)

(72) Inventors: Wei Lu, Ann Arbor, MI (US); Sung Hyun Jo, Ann Arbor, MI (US); Kuk-Hwan Kim, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 14/563,698

(22) Filed: Dec. 8, 2014

(65) Prior Publication Data

US 2015/0138873 A1 May 21, 2015

Related U.S. Application Data

(63) Continuation of application No. 13/291,094, filed on Nov. 7, 2011, now Pat. No. 8,907,317, which is a continuation of application No. 12/582,086, filed on Oct. 20, 2009, now Pat. No. 8,071,972.

(60) Provisional application No. 61/106,893, filed on Oct. 20, 2008.

(51) Int. Cl.
*H01L 45/00* (2006.01)
*G11C 13/00* (2006.01)
*B82Y 10/00* (2011.01)
(Continued)

(52) U.S. Cl.
CPC .............. *G11C 13/0069* (2013.01); *B82Y 10/00* (2013.01); *G11C 11/5614* (2013.01); *G11C 13/004* (2013.01); *G11C 13/0011* (2013.01); *G11C 13/0097* (2013.01); *H01L 27/2409* (2013.01); *H01L 27/2463* (2013.01); *H01L 27/2472* (2013.01); *H01L 45/085* (2013.01); *H01L 45/1233* (2013.01); *H01L 45/1266* (2013.01); *H01L 45/148* (2013.01); *H01L 45/1675* (2013.01); *B82Y 30/00* (2013.01); *G11C 2013/005* (2013.01); *G11C 2013/0071* (2013.01); *G11C 2213/11* (2013.01); *G11C 2213/33* (2013.01); *G11C 2213/77* (2013.01); *G11C 2213/81* (2013.01)

(58) Field of Classification Search
CPC ........ B82Y 10/00; B82Y 20/00; B82Y 30/00; B82Y 40/00; H01L 27/2409; H01L 27/2463; H01L 27/2472; H01L 45/085; H01L 45/1233; H01L 45/1266; H01L 45/148; H01L 45/1675; G11C 13/0011; G11C 13/004; G11C 13/0069; G11C 13/0097; G11C 11/5614; G11C 2213/11; G11C 2213/33; G11C 2213/77; G11C 2213/81; G11C 2013/005; G11C 2013/0071

See application file for complete search history.

(56) References Cited

U.S. PATENT DOCUMENTS 7,489,583 B2 * 2/2009 Kuekes et al. ........... 365/230.02
7,671,398 B2 * 3/2010 Tran .............................. 257/315

(Continued)

*Primary Examiner* — Nikolay Yushin
(74) *Attorney, Agent, or Firm* — Reising Ethington P.C.

(57) ABSTRACT

The present application describes a crossbar memory array. The memory array includes a first array of parallel nanowires of a first material and a second array of parallel nanowires of a second material. The first and the second array are oriented at an angle with each other. The array further includes a plurality of nanostructures of non-crystalline silicon disposed between a nanowire of the first material and a nanowire of the second material at each intersection of the two arrays. The nanostructures form a resistive memory cell together with the nanowires of the first and second materials.

26 Claims, 28 Drawing Sheets

(51) Int. Cl.
  *G11C 11/56* (2006.01)
  *H01L 27/24* (2006.01)
  *B82Y 30/00* (2011.01)

(56) References Cited

U.S. PATENT DOCUMENTS

| | | | |
|---|---|---|---|
| 7,778,061 B2 * | 8/2010 | Robinett et al. | 365/148 |
| 8,446,752 B2 * | 5/2013 | Sun et al. | 365/148 |
| 8,592,791 B2 * | 11/2013 | Tour et al. | 257/3 |
| 2006/0198209 A1 * | 9/2006 | Tran | 365/189.05 |
| 2007/0053378 A1 * | 3/2007 | Kuekes et al. | 370/464 |
| 2008/0089110 A1 * | 4/2008 | Robinett et al. | 365/148 |
| 2008/0237886 A1 * | 10/2008 | Wu et al. | 257/776 |
| 2010/0110764 A1 * | 5/2010 | Sun et al. | 365/148 |
| 2010/0155692 A1 * | 6/2010 | Tran | 257/9 |

\* cited by examiner

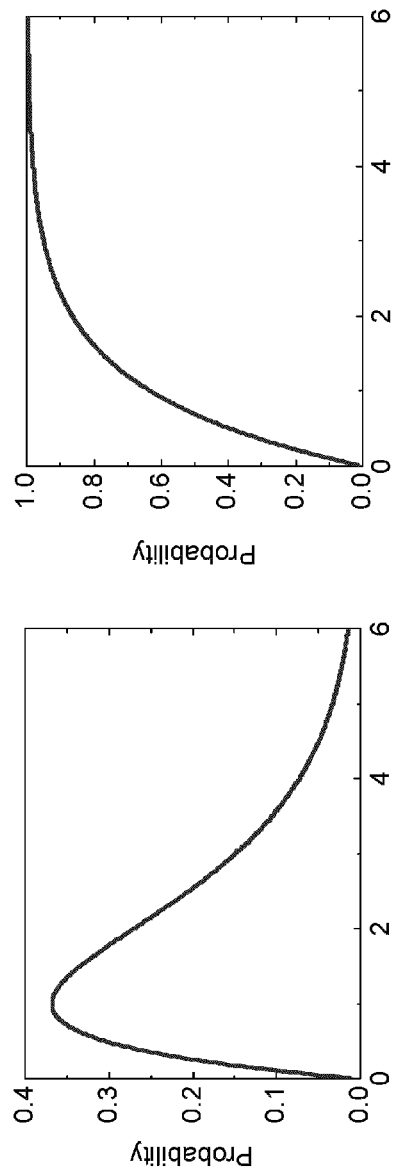
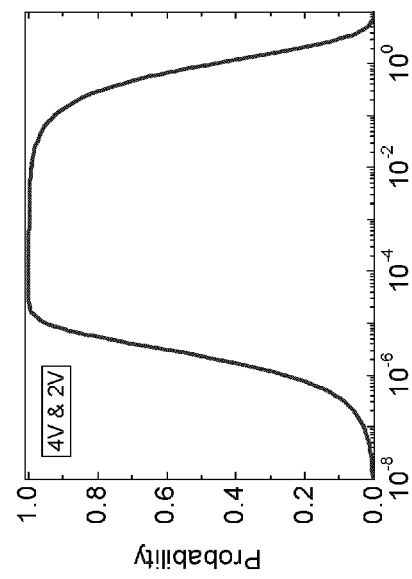
FIG. 3(c)
FIG. 3(d)
FIG. 3(e)

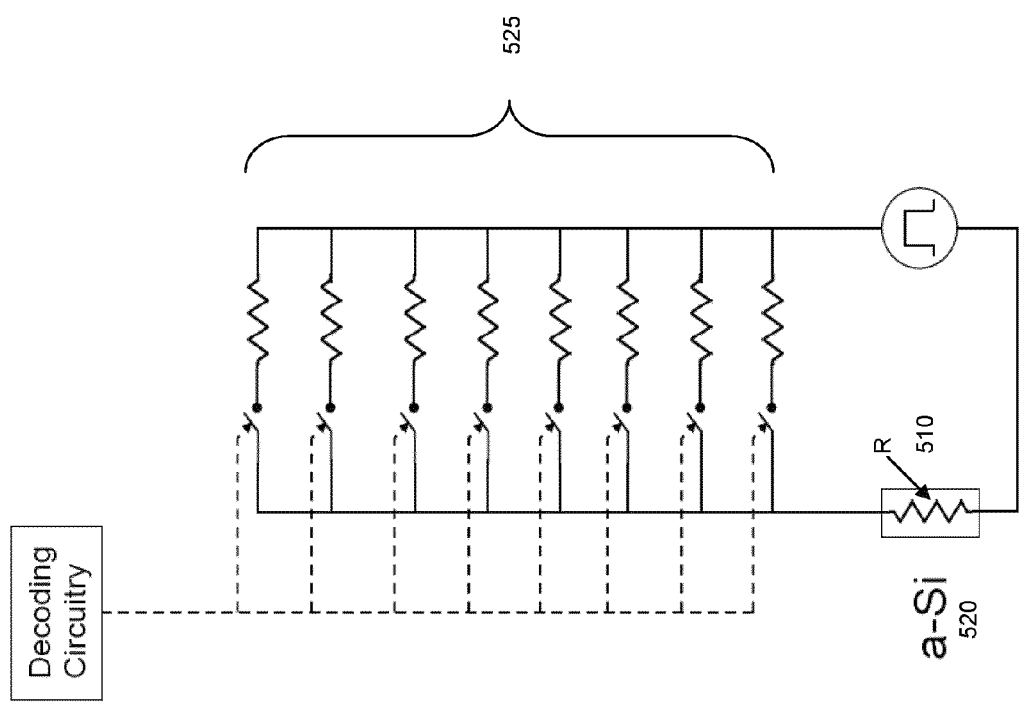

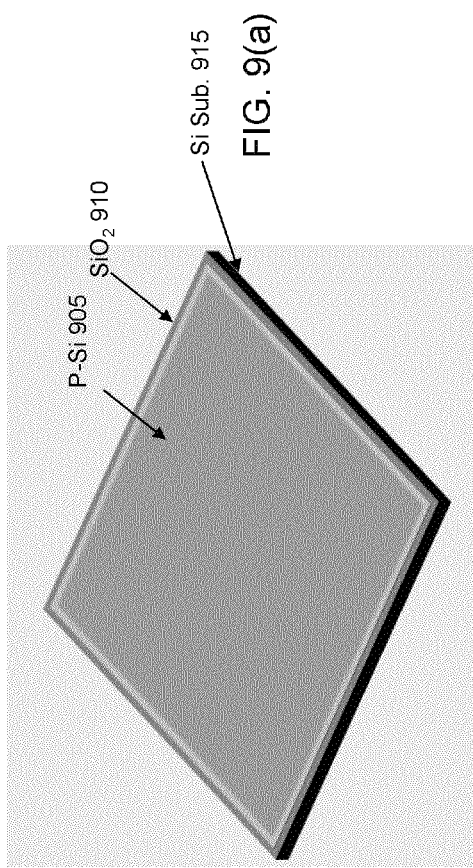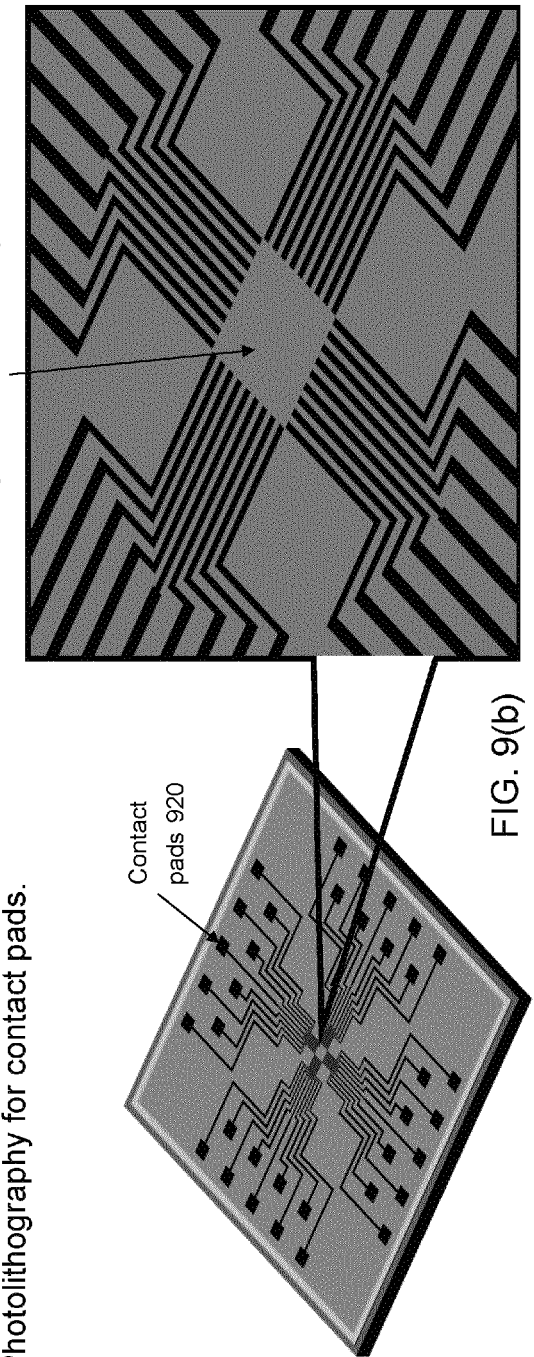

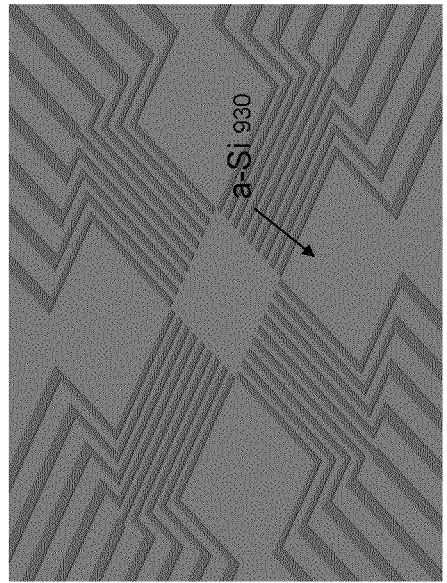
Global Amorphous Si deposition
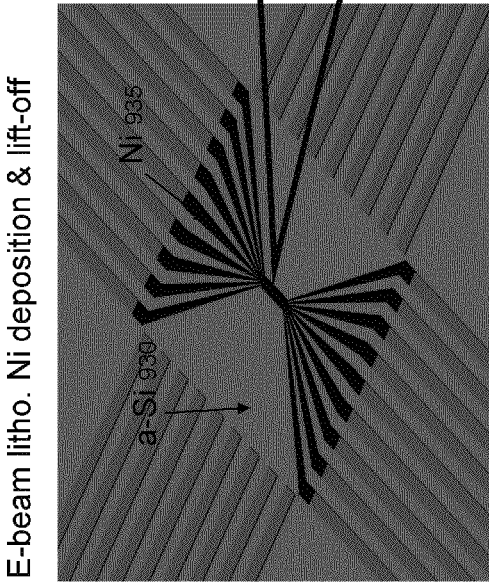
E-beam litho. Ni deposition & lift-off
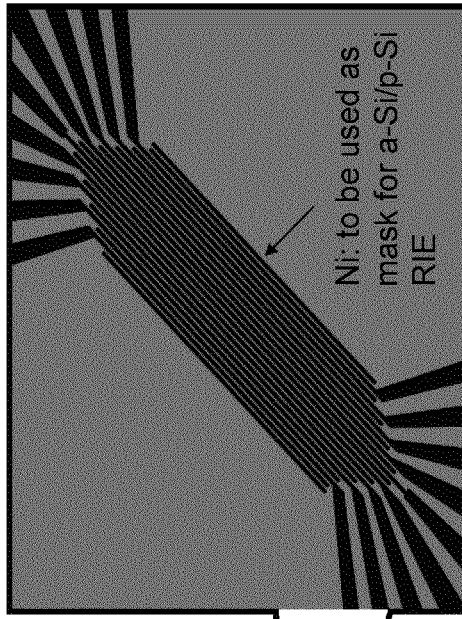
The a-Si deposition condition mainly determines device performance.
FIG. 9(c)
FIG. 9(d)
Ni: to be used as mask for a-Si/p-Si RIE

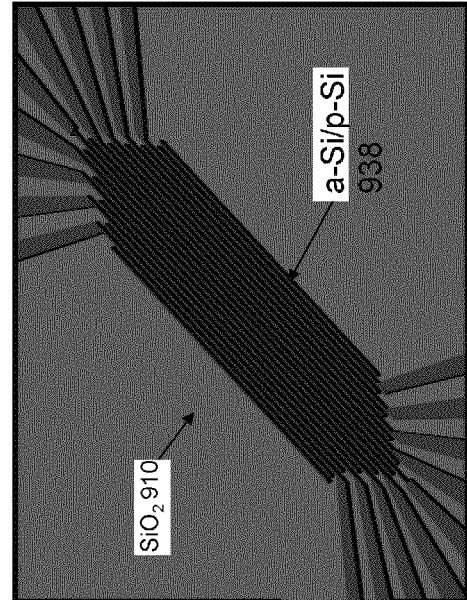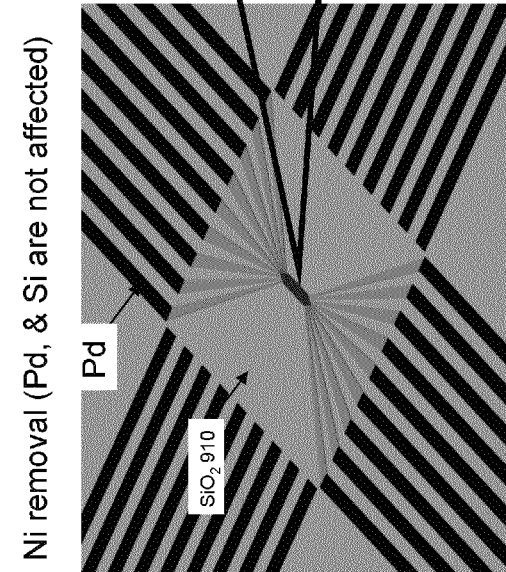
FIG. 9(e)
FIG. 9(f)

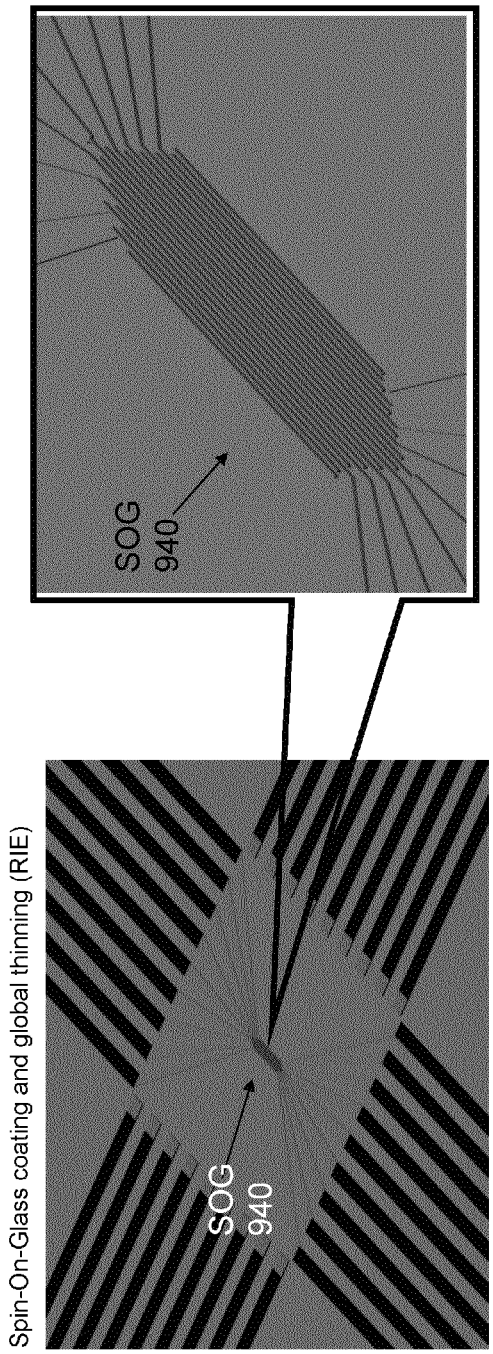
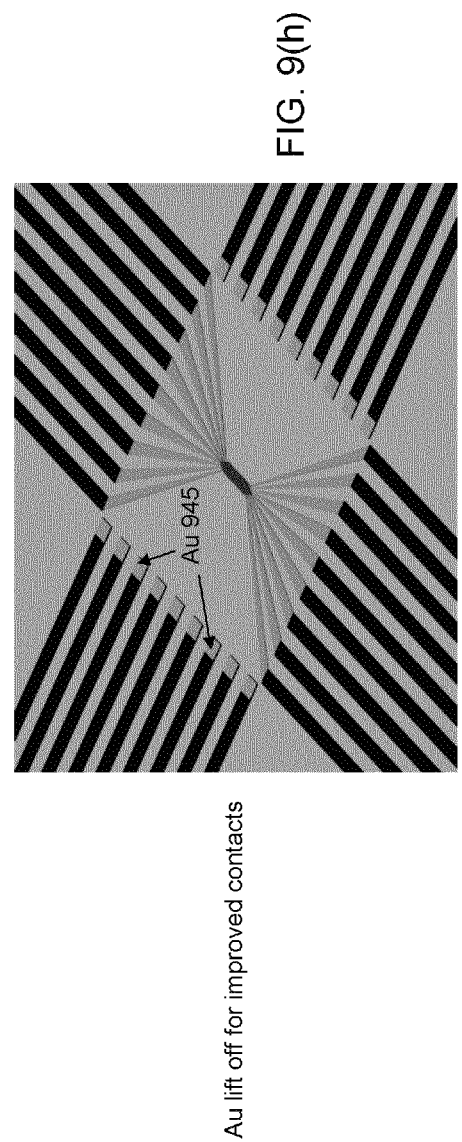
FIG. 9(g)
FIG. 9(h)

Pd/Ag deposition

SOG etch

Photolithography for top metal lift-off

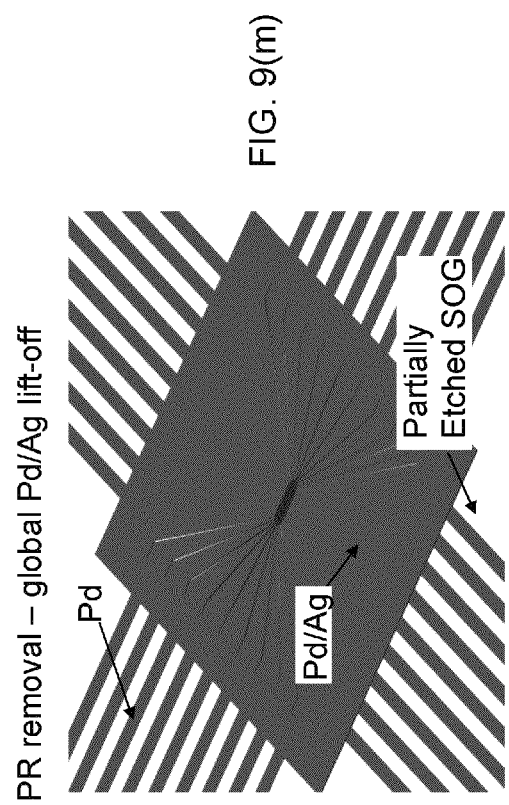
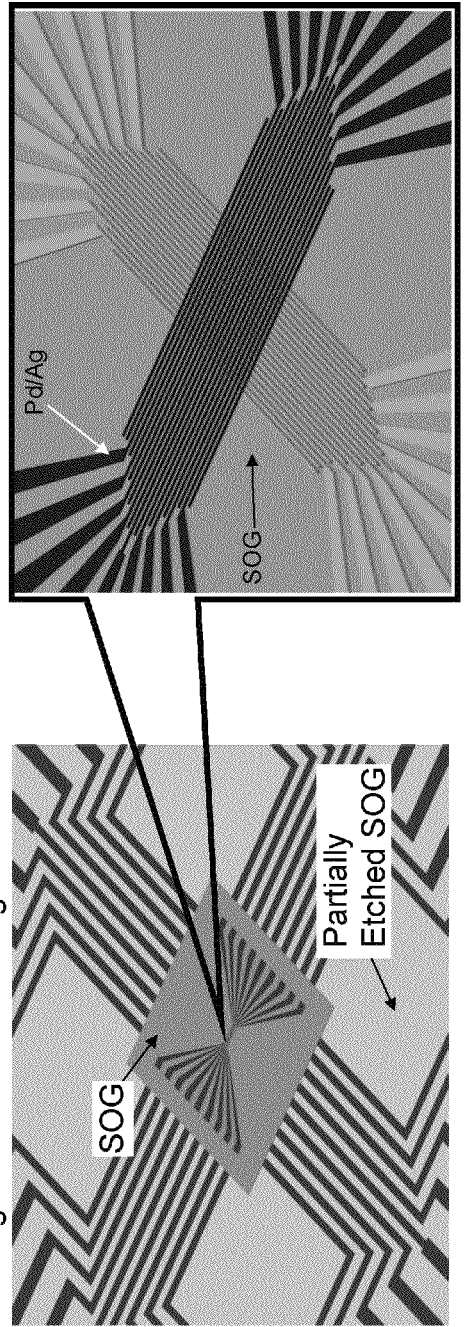
FIG. 9(m)
FIG. 9(n)

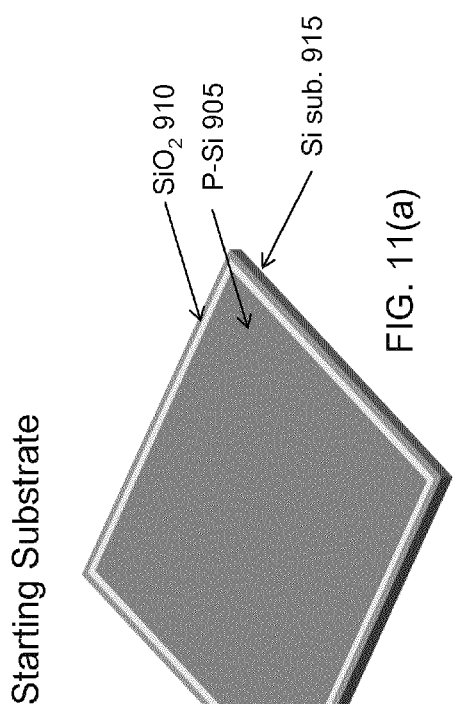
FIG. 11(a) Starting Substrate
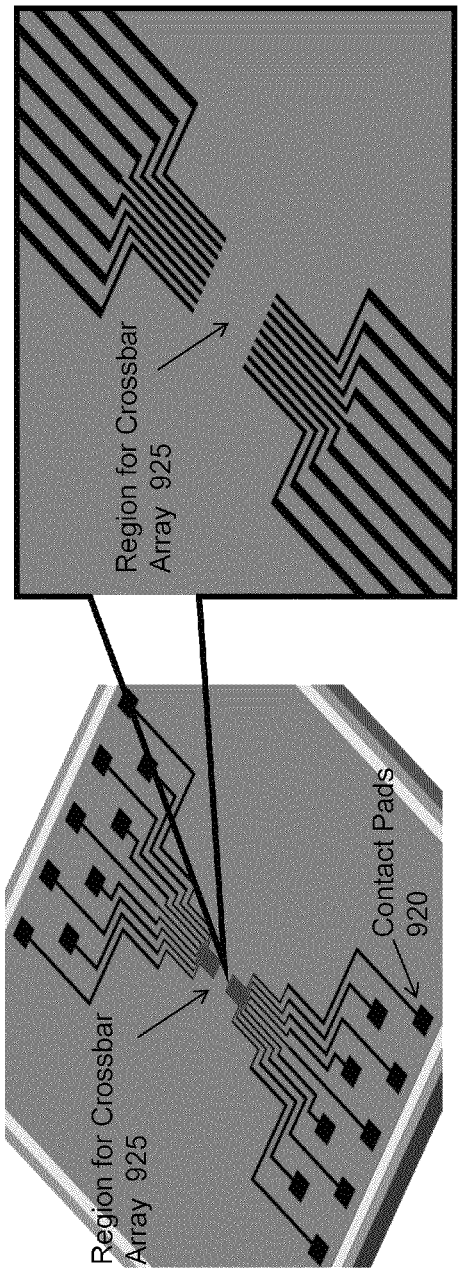
FIG. 11(b) Photolithography for Ni/Pd Bottom electrodes

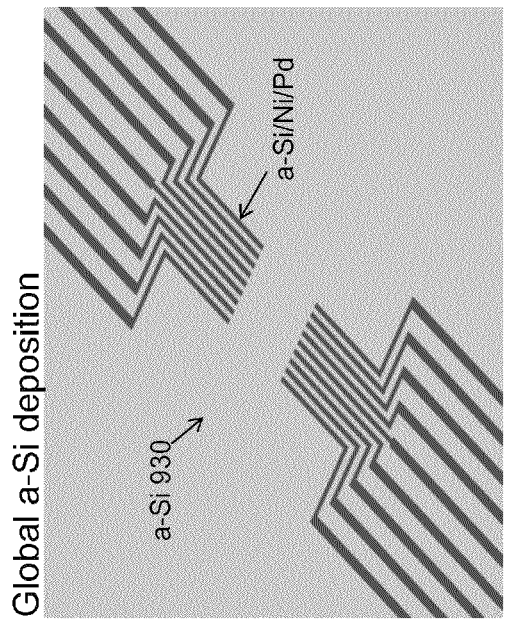
FIG. 11(c) Global a-Si deposition
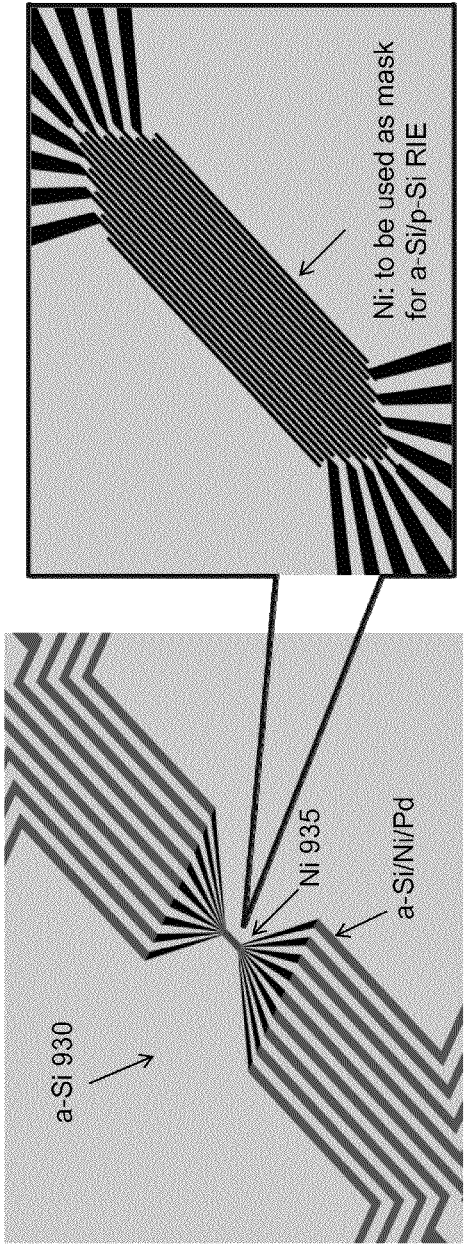
FIG. 11(d) Ni deposition for etching mask (for a-Si/Poly-Si)

FIG. 11(i) Ag lift-off

SILICON BASED NANOSCALE CROSSBAR MEMORY

CROSS REFERENCE TO RELATED APPLICATIONS

This application is a continuation of U.S. patent application Ser. No. 13/291,094, filed Nov. 7, 2011, now U.S. Pat. No. 8,907,317, which is a continuation of U.S. patent application Ser. No. 12/582,086 filed Oct. 20, 2009, now U.S. Pat. No. 8,071,972, which claims the benefit of U.S. Provisional Application No. 61/106,893 filed Oct. 20, 2008. The entire contents of these prior applications are hereby incorporated by reference.

TECHNICAL FIELD

The invention relates to solid state resistive devices used for memory storage.

BACKGROUND

Resistive random-access memories (RRAMs) have generated significant interest recently as a potential candidate for ultra-high density non-volatile information storage. A typical RRAM device consists of an insulator layer sandwiched between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. Resistance switching has also been explained by field assisted diffusion of ions in $TiO_2$ and amorphous silicon (a-Si) films.

In the case of a-Si structures, voltage-induced diffusion of metal ions into the silicon leads to the formation of conductive filaments that reduce the resistance of the a-Si structure. These filaments remain after the biasing voltage is removed, thereby giving the device its non-volatile characteristic, and they can be removed by reverse diffusion of the ions back to the metal electrode under the motive force of a reverse polarity applied voltage.

Resistive devices formed by an a-Si structure sandwiched between two metal electrodes have been shown to exhibit this controllable resistive characteristic. However, such devices typically have micron sized filaments which may prevent them from being scaled down to the sub-100 nanometer range. Such devices may also require high forming voltages that can lead to device damage and can limit production yields.

SUMMARY

In one aspect, a crossbar memory array includes a first array of parallel nanowires of a first material and a second array of parallel nanowires of a second material. The first and the second array are oriented at an angle with each other. The array further includes a plurality of nanostructures of non-crystalline silicon, with a nanostructure disposed between a nanowire of the first material and a nanowire of the second material at each intersection of the two arrays. The nanostructures form a resistive memory cell together with the nanowires of the first and second materials.

In another aspect, a method for fabricating an array of resistive memory devices includes forming a first array of parallel nanowires of a first material on a substrate. A plurality of non-crystalline silicon nanostructures are formed on the first array of parallel nanowires. The method further includes forming a second array of parallel nanowires of a second material on the plurality of non-crystalline silicon nanostructures. The second array is oriented at an angle with the first array such that each intersection of the first array and the second array includes one of the non-crystalline silicon nanostructures disposed between a nanowire of the first material and a nanowire of the second material to form a resistive memory cell.

In still another aspect, a non-volatile solid state resistive device is presented. The device includes a substrate, a first electrode and an n-type silicon second electrode on the substrate. A p-type silicon body is vertically stacked between the first electrode and the n-type silicon electrode and in contact with the n-type silicon second electrode, forms a PN diode. The device further includes a non-crystalline silicon nanostructure vertically stacked between the first electrode the a p-type silicon body.

Implementations of the crossbar memory can include one or more of the following features. The first material of the crossbar memory array may be chosen from one of the following metals: silver (Ag), gold (Au), nickel (Ni), aluminum (Al), chromium (Cr), iron (Fe), manganese (Mn), tungsten (W), vanadium (V) and cobalt (Co). At least one of the plurality of non-crystalline silicon nanostructures may be a nanoscale pillar providing a contact point between the first and second arrays at exactly one intersection. At least one of the plurality of non-crystalline silicon nanostructures may be a nanowire providing contact points between the first and second arrays at a plurality of intersections. An angle between the first and second parallel arrays may be substantially equal to a right angle. An insulator or dielectric material, such as spin-on-glass (SOG), may at least partially separate the two arrays. The crossbar memory array may be used either as a resistive random access memory (RRAM) or as read only memory (ROM). Each of the plurality of non-crystalline silicon nanostructures may exhibit variable resistance that can be adjusted based on an amplitude of a voltage or current and/or a duration of the voltage or current which is applied across the resistive memory cell.

Implementations of the method for fabricating the array of resistive memory devices may include one or more of the following features. The first material and second materials may be acceptor doped silicon and a metal, respectively. The first material may be a metal and the second material may be acceptor doped silicon. Both the first and the second materials may be metals different from one another. The acceptor used in the acceptor doped silicon may be Boron. The removing step may include reactive ion etching (RIE). The insulator may be spin-on-glass (SOG) and may be deposited via spin coating and thermal curing methods. The method may includes the use of one or more micro-fabrication techniques such as e-beam lithography, chemical vapor decomposition (CVD) and lift-off.

Potential advantages can include the following. The crossbar memory arrays described herein can exhibit excellent switching characteristics in terms of yield, speed, endurance and retention and can be used as a medium for ultra-high density non-volatile information storage. Probability based bias and time dependent switching characteristics of the a-Si based memory arrays can facilitate applications of the crossbar memory arrays in new applications such as artificial intelligence and simulation of biologically inspired systems.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein:

FIG. 3(c) is a graph of the probability of a single, discrete resistance switching event over time for a typical a-Si device when applying a given bias voltage without any series connected control resistor;

FIG. 3(d) is a graph of the probability of having at least one resistance switching event over time for a typical a-Si device when applying a given bias voltage without any series connected control resistor;

FIG. 3(e) is a graph of the probability of a single, discrete resistance switching event over time for a typical a-Si device when using a series connected control resistor;

FIG. 5(a) shows a schematic diagrams illustrating how multi-level resistance can be used in circuits for storing multiple bits in a single cell;

FIG. 9(a) shows a result of an initial step according to an embodiment of a method for fabricating a crossbar memory array;

FIG. 9(b) illustrates a result of a step of forming contact pads and traces according to embodiments of the present invention;

FIG. 9(c) illustrates a result of a step of depositing one or more layers of material according to embodiments of the present invention;

FIG. 9(d) illustrates a result of a step of patterning the one or more layers of material according to embodiments of the present invention;

FIG. 9(e) illustrates a result of a step of etching one or more layers of material according to embodiments of the present invention;

FIG. 9(f) illustrates a result of a step of removing a mask layer according to embodiments of the present invention;

FIG. 9(g) illustrates a result of a step of depositing a layer of material according to embodiments of the present invention;

FIG. 9(h) illustrates a result of a step of patterning a layer of material according to embodiments of the present invention;

FIG. 9(m) illustrates a result of a step of patterning one or more layers of material according to embodiments of the present invention;

FIG. 9(n) illustrates a result of a step of patterning one or more layers of material according to embodiments of the present invention;

FIG. 11(a) shows a result of an initial step according to another embodiment of a method for fabricating a crossbar memory array;

FIG. 11(b) illustrates a result of a step of forming contact pads and traces according to embodiments of the present invention;

FIG. 11(c) illustrates a result of a step of depositing one or more layers of material according to embodiments of the present invention;

FIG. 11(d) illustrates a result of a step of patterning the one or more layers of material according to embodiments of the present invention;

FIG. 11(i) illustrates a result of a step of patterning one or more layers of material according to embodiments of the present invention.

DETAILED DESCRIPTION

Figure 1A:
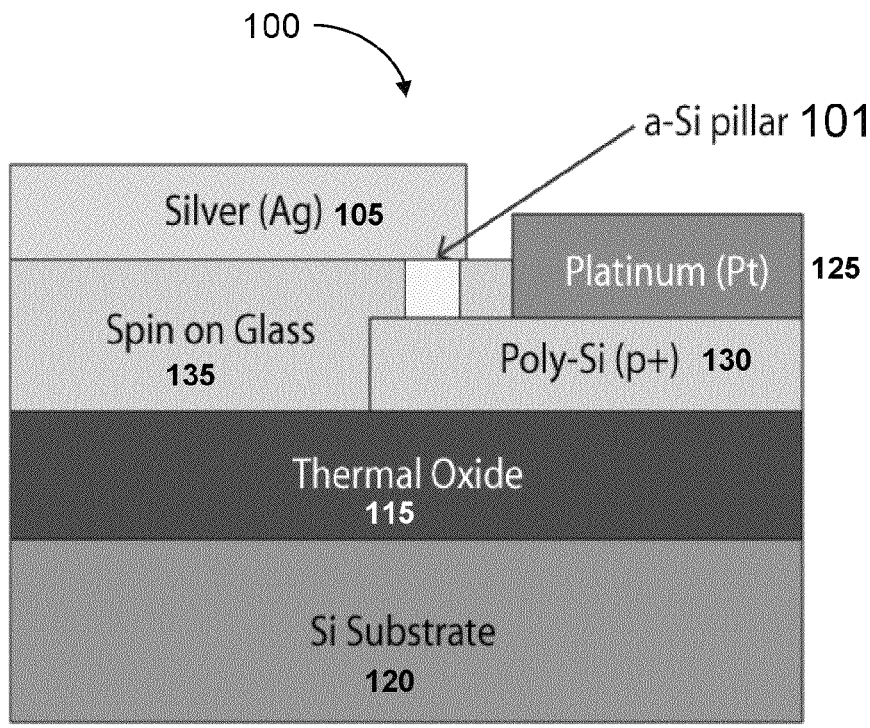
FIG. 1(a) is a diagrammatic view of one embodiment of a single cell a-Si resistive device.

FIG. 1(a) depicts a non-volatile solid state resistive device 100 comprising a nanoscale a-Si structure 101 that exhibits a resistance that can be selectively set to various values, and reset, all using appropriate control circuitry. Once set, the resistance value can be read using a small voltage that is sufficient in magnitude to determine the resistance without causing it to change. Although the illustrated embodiment uses a-Si as the resistive element, it will be appreciated that other non-crystalline silicon (nc-Si) structures can be used, such as amorphous poly-silicon (sometimes called nanocrystalline silicon, an amorphous phase that includes small grains of crystalline silicon). Thus, as used herein and in the claims, noncrystalline silicon (nc-Si) means either amorphous silicon (a-Si), amorphous poly-silicon (poly-Si) that exhibits controllable resistance, or a combination of the two. Furthermore, although much of the discussion herein applies also to larger scale a-Si structures such as those having one or more dimensions in the micron range, the illustrated embodiment is an a-Si nanostructure 101 that exhibits certain characteristics unique to its small scale. The term nanostructure, as used herein, refers to a structure having at least two dimensions in the nanoscale range; for example, structures having a diameter or plural cross-sectional dimensions within the general range of 0.1 to 100 nanometers. This includes structures having all three spatial dimensions in the nanoscale; for example, a cylindrical nanocolumn or nanopillar having a length that is on the same order as its nanoscale diameter. Nanostructures can include the various nanoscale structures known to those skilled in the art; for example, nanotubes, nanowires, nanorods, nanocolumns, nanopillars, nanoparticles, and nanofibers. One such structure 101 is the embodiment depicted in FIGS. 1(a) and 1(b), which is a plug or pillar structure that can be circular in cross-section with a diameter of less than 100 nm (e.g., 60 nm in the particular example shown). The pillar height or length, depending upon the orientation, can be nanoscale (e.g., 30 nm as in the illustrated example) or larger.

Figure 1B:
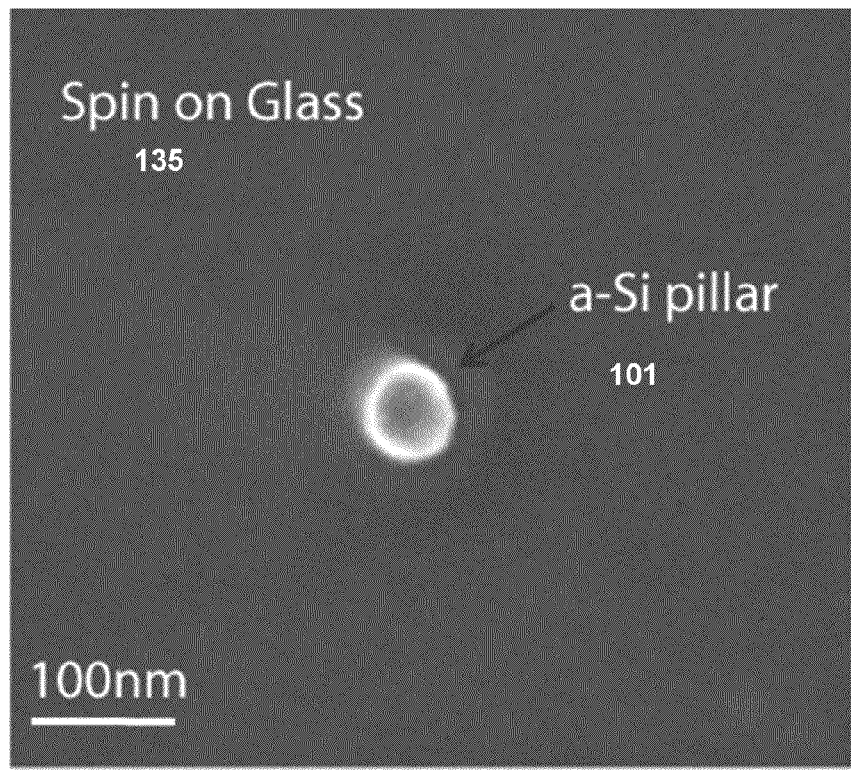
FIG. 1(b) is an SEM image of a top view of a partially-constructed a-Si structure such as shown in FIG. 1(a)

The a-Si structure of FIGS. 1(a) and 1(b) is embedded in an insulating dielectric which can be made of various materials and constructed in different ways, but as shown in the figures is a spin-on-glass (SOG) layer 135 that initially is flowed around the a-Si structure 101 and then solidified, all of which can be done using known processes. The overall resistive device is built up using a silicon substrate layer that is covered by a thermal dioxide layer 115. Underlying the a-Si pillar 101 is a boron-doped or other p-type polysilicon electrode 130 that is in contact with a lower end face of the a-Si pillar 101 and that extends laterally away from the a-Si pillar 101 to accommodate an overlying metal electrode 125 that can be made of any suitable metal, including, for example, a platinum group metal such as palladium or platinum. Opposite the poly-silicon (p-Si) electrode 130 on the upper surface (end face) of the a-Si pillar 101 is a silver (Ag) metal electrode 105 that acts as the source of filament-forming ions. Although silver is used in the illustrated embodiment, it will be understood that the electrode 105 (as well as the other metal electrode) can be formed from various other suitable metals, such as gold (Au), nickel (Ni), aluminum (Al), chromium (Cr), iron (Fe), manganese (Mn), tungsten (W), vanadium (V), cobalt (Co). Other suitable metals capable of supplying filament-forming ions can be used as well.

To fabricate the a-Si device of FIG. 1(a), the B-doped p-Si bottom electrode layer can be deposited by LPCVD (low pressure chemical vapor deposition) on a prime grade silicon substrate 120 with a 200 nm thermal dioxide 115. The amorphous silicon layer can be a 30 nm thick layer deposited on top of the B-doped p-Si, followed by two RIE (reactive ion etching) steps to define the a-Si pillar 101 and the p-Si bottom electrode 130 structures. Spin-on Glass (SOG) 135 can then be spin coated on the sample at a speed of 3000 RPM and then cured at 320° C. for 1 hour. This insulating SOG layer 135 provides electrical isolation of the two opposing electrodes as well as mechanical support for the a-Si pillar 101. After being formed, the SOG layer 135 can be partially etched away to create a flat surface and to expose the surface of the a-Si pillar 101. The Ag electrode 105 can then be formed on the exposed end surface of the a-Si pillar by patterning using a lift-off process. Then the second metal (platinum) electrode can be applied to provide ohmic contact to the bottom p-Si layer 130. The platinum electrode 125 is located near the a-Si pillar 101 to help minimize resistance through the p-Si electrode 130, and this distance is preferably no more than 100 nm. The pattern design can be chosen so as to minimize the overlap between the top and bottom electrodes so as to keep a low direct leakage current through the SOG 135. It will be understood by those skilled in the art that various modifications to this fabrication procedure can be done, and that other fabrication approaches can be used as well to achieve either the structure of FIG. 1(a) or another suitable nc-Si structure that permits resistive adjustability of the device. U.S. Patent Application Publication No. 2009/0014707 A1 provides additional information concerning the characteristics, use, and operation of non-volatile solid state resistive switching devices such as the a-Si device shown in FIGS. 1(a) and 1(b). It also provides information concerning the construction of an alternative embodiment of an a-Si device, at least some of which is applicable to the construction of the a-Si device shown in FIGS. 1(a) and 1(b). The information contained in U.S. Patent Application Publication No. 2009/0014707 A1 concerning the fabrication, construction, and use of the non-volatile solid state resistive switching devices disclosed therein is hereby incorporated by reference.

A single a-Si device 100 as shown in FIG. 1(a) can be used as a stand-alone reconfigurable interconnect or memory bit with its independently controlled top and bottom electrode pairs. The use of chemical-vapor deposition (CVD) deposited polysilicon as the bottom contact enables device fabrication on a variety of substrates including the potential for multilayered 3D structure integration. As compared with a continuous a-Si film, the illustrated a-Si plug structure helps ensure that the active a-Si region and the filament area are physically well defined. Furthermore, this construction of the device is fully compatible with CMOS technology and can be readily incorporated into existing systems as high-density non-volatile memories or as reconfigurable interconnects in logic circuits such as neuromorphic networks.

Figure 1C:
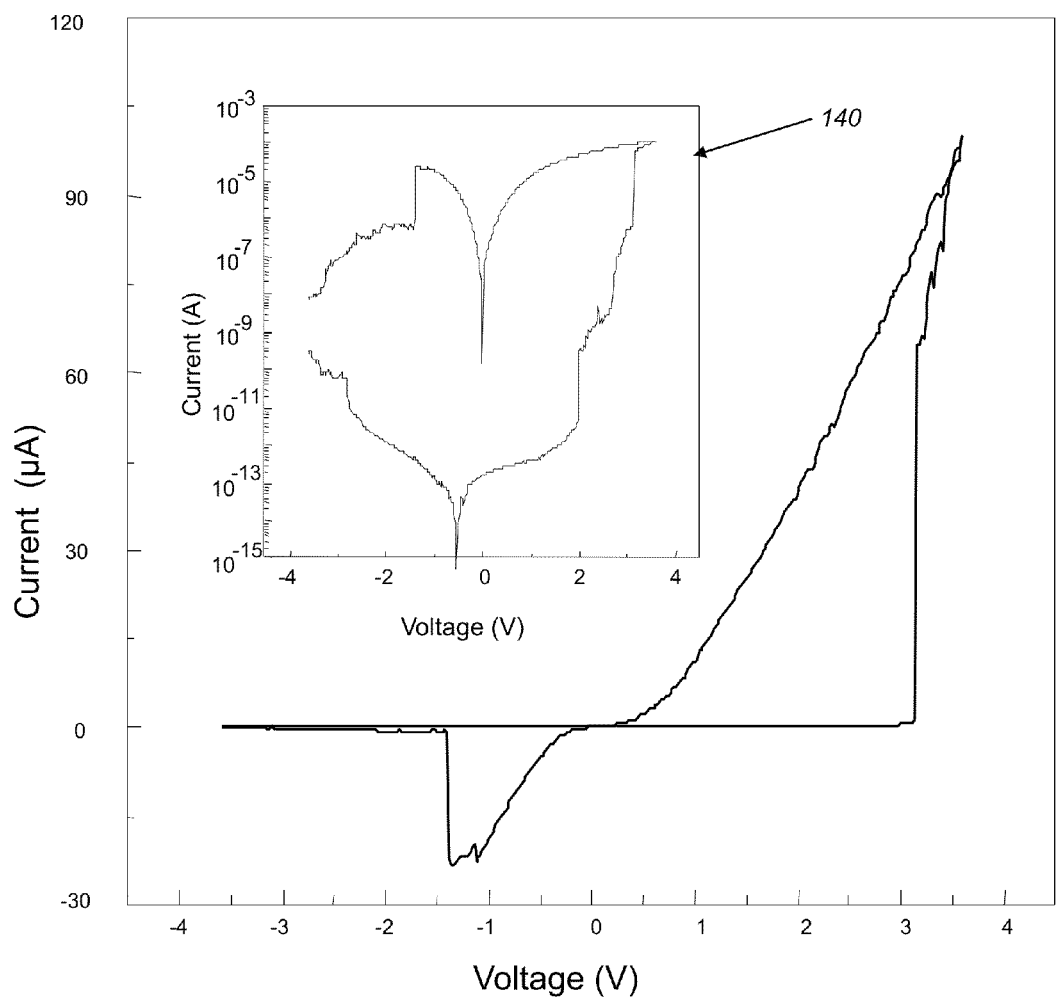
FIG. 1(c) is a graph showing resistance switching characteristic of a typical a-Si structure, such as shown in FIG. 1(a)
Figure 1D:
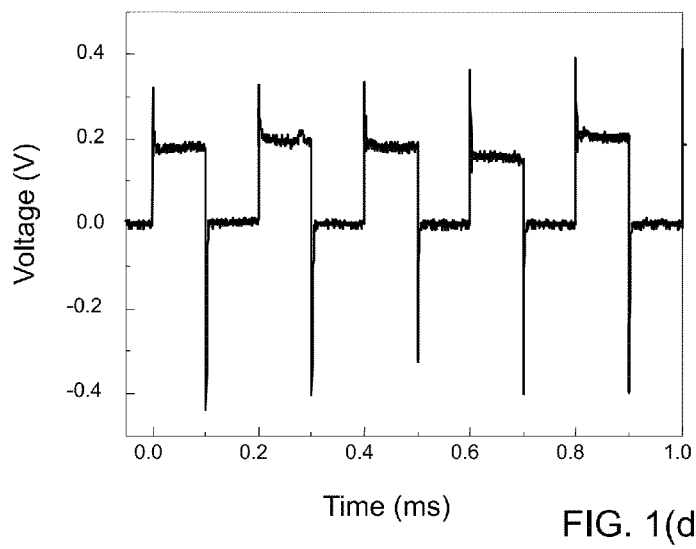
FIG. 1(d) is a waveform showing the programming response for an a-Si device such as shown in FIG. 1(a)
Figure 1E:
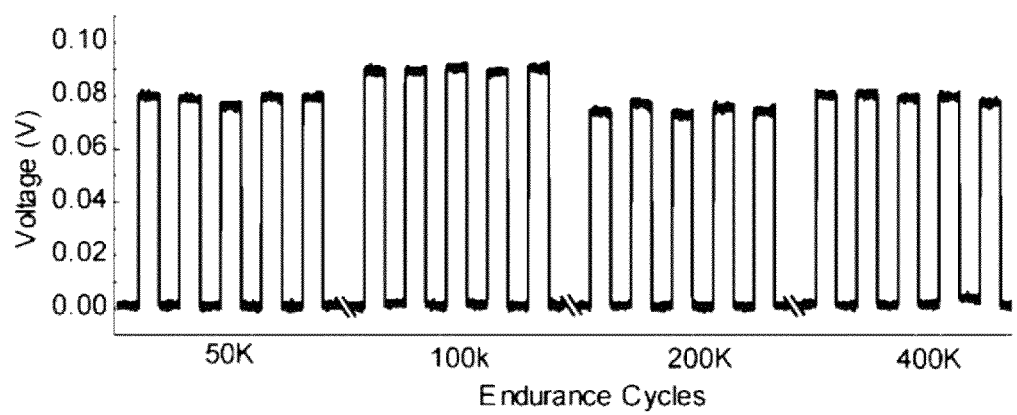
FIG. 1(e) is a waveform showing the results of endurance testing of an a-Si device such as shown in FIG. 1(a)

FIG. 1(c) shows the resistance switching characteristics of a typical a-Si pillar 101 such as shown in FIG. 1(a); e.g., for a device with a diameter of about 60 nm and a thickness of 30 nm. It includes an inset graph 140 of this switching characteristic in log scale showing the stepwise transition during the turn-on process. High voltage forming is not required for these nanoscale a-Si switches and the device after forming can be repeatedly switched between the low-resistance ON and high-resistance OFF states by applying positive write and negative erase voltage pulses. In some implementations, the ON/OFF resistance ratio measured at small bias can be as high as $10^7$. Testing of a-Si devices fabricated in the manner discussed above have shown that, as a memory device, the a-Si switch exhibits excellent performance metrics in terms of yield (e.g. >95% for devices with 60 nm diameter a-Si pillars), speed, endurance and retention. FIG. 1(d) shows a representative write-read-erase-read pulse sequence with 50 ns write/erase pulse widths and the output response from a typical device. Results from endurance test of the device are shown in FIG. 1(e). A typical device with on-current <20 µA is expected to survive greater than $10^5$ programming cycles without degradation. Beyond this limit the OFF state conductance can start to increase, thereby resulting in a reduced ON/OFF resistance ratio.

Figure 2A:
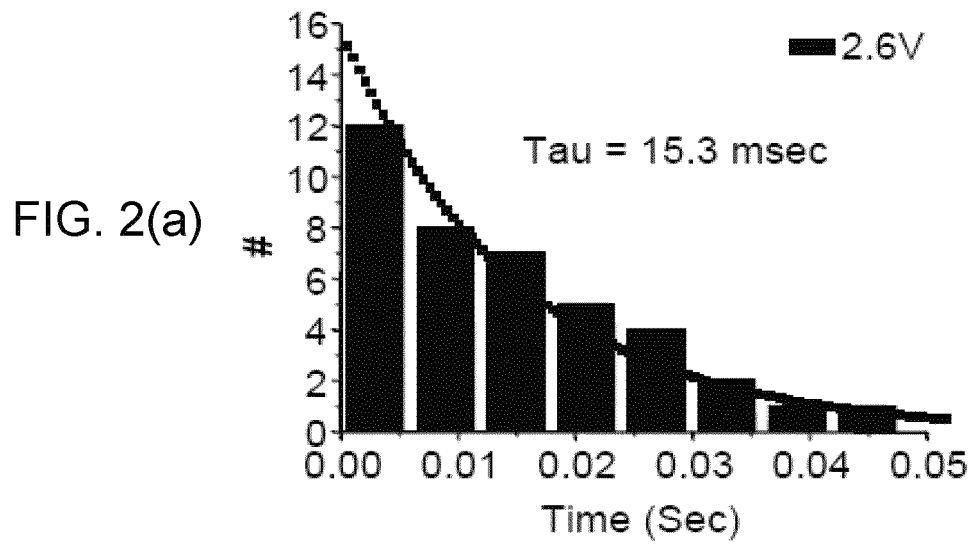
FIGS. 2(a)-2(c) depict histograms of the switching response of a typical a-Si device for different bias voltages.
Figure 2B:
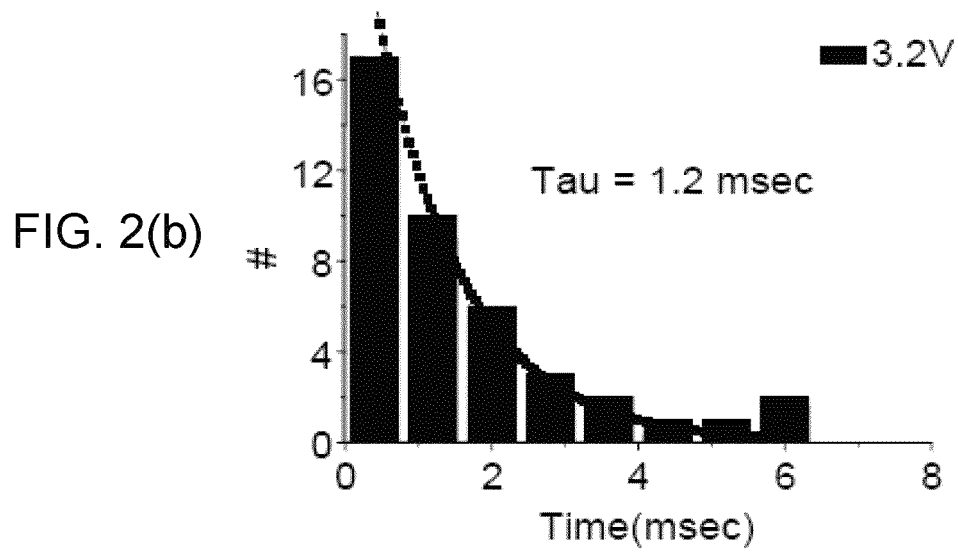
Figure 2C:
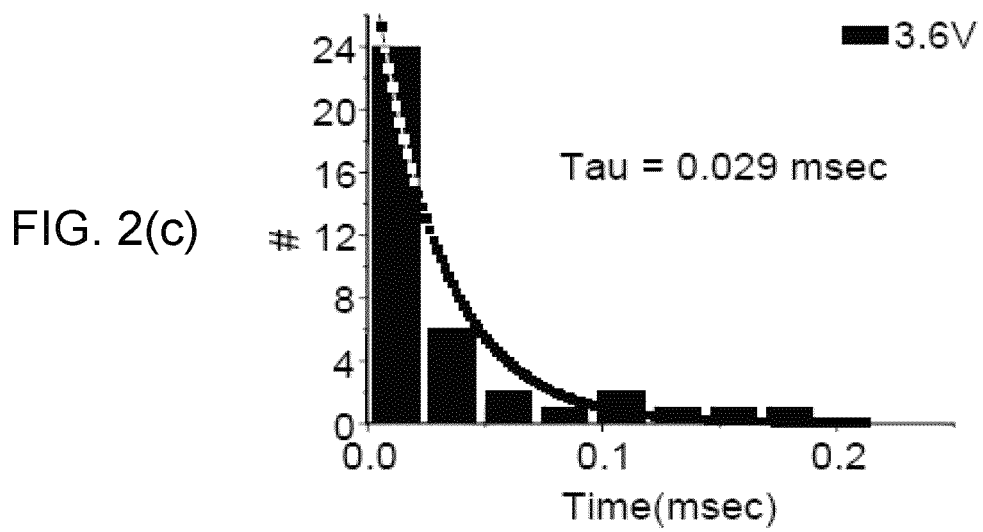
Figure 2D:
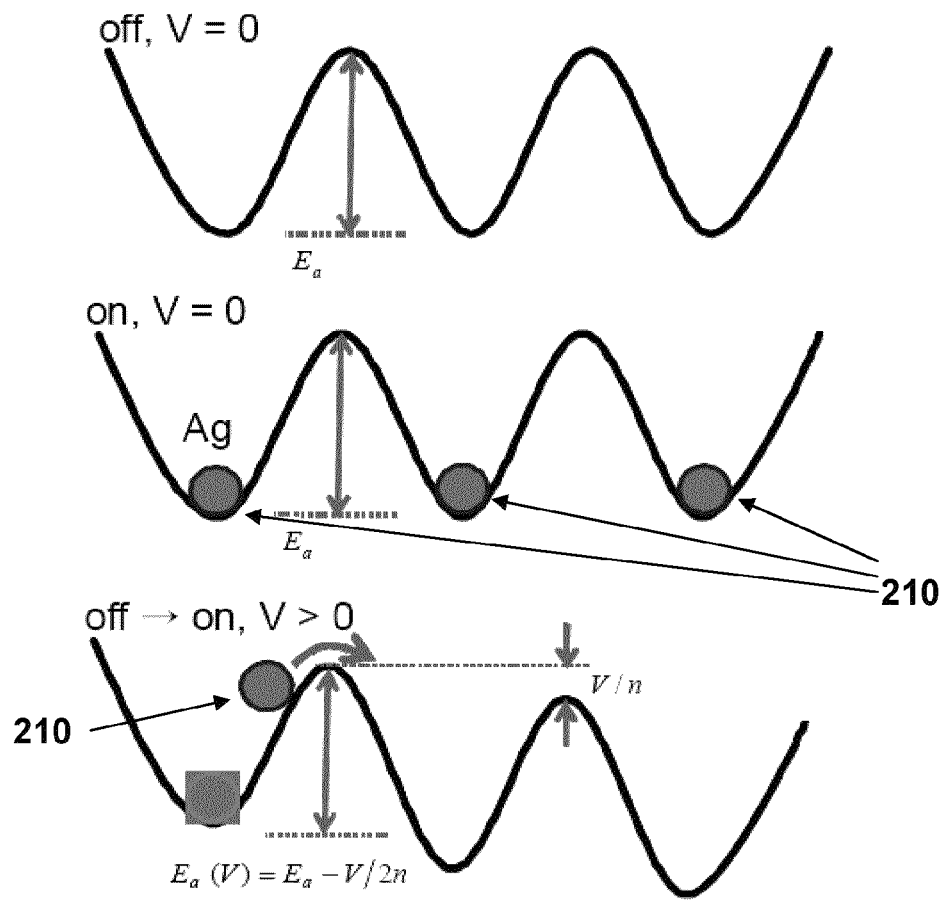
FIG. 2(d) is a three-part diagram showing the metal ion diffusion at different conductive states of an a-Si device such as shown in FIG. 1(a)

The switching in an a-Si structure 101 can be explained by the formation and retrieval of a nanoscale Ag filament upon the application of the programming voltage, schematically illustrated in FIG. 2(d). In previous experimental and theoretical studies on microscale metal/a-Si/metal structures, the filament was suggested to be in the form of a series of Ag particles 210 trapped in defect sites in the a-Si layer. The conduction mechanism in the ON state is electron tunneling through the Ag chain and the device resistance is then dominated by the tunneling resistance between the last Ag particle 210 and the bottom electrode. As indicated in FIG. 1(c), this behavior is consistent with the stepwise increase in current in log scale during the OFF-ON transition as the Ag filament grows in a step-by-step fashion when an additional Ag particle 210 hops into a new trapping site.

The well-defined active switching area in the a-Si pillar structure 101 along with the fine control offered by the CMOS compatible fabrication process enables detailed studies to explore the unique characteristics offered by the resistive switching devices. One direct consequence of the filament formation model is that the switching rate will be bias dependent, since unlike electron tunneling, the hopping of the Ag particles 210 is a thermally activated process and the rate is determined by the bias-dependent activation energy $E_a'(V)$:

$$\Gamma = 1/\tau = v e^{-E_a'(V)/k_B T} \quad (1)$$

where $k_B$ is Boltzmann's constant, T is the absolute temperature, $\tau$ is the characteristic dwell time and $v$ is the attempt frequency. As indicated in FIG. 2(d), the activation energy may be lowered by the application of the bias voltage, resulting in bias-dependent wait time and switching rates.

This effect has been verified through a study of the wait time for the first transition (i.e., the first current step in FIG. 1(c)) as a function of bias voltage. The wait time was measured by applying a square pulse with a given voltage magnitude to the device in OFF state and measuring the lapse in time t until the first sharp increase in current. The device was then erased by a negative voltage pulse and the measurement was repeated. FIGS. 2(a)-(c) show the histograms of the wait time for the first transition at bias voltages of 2.6 V, 3.2 V and 3.6 V on the same device. Because the stochastic nature of the switching process, the wait time should follow Poisson distribution and the probability that a switching occurs within $\Delta t$ at time t is given by:

$$P(t) = \frac{\Delta t}{\tau} e^{-t/\tau} \quad (2)$$

Figure 2E:
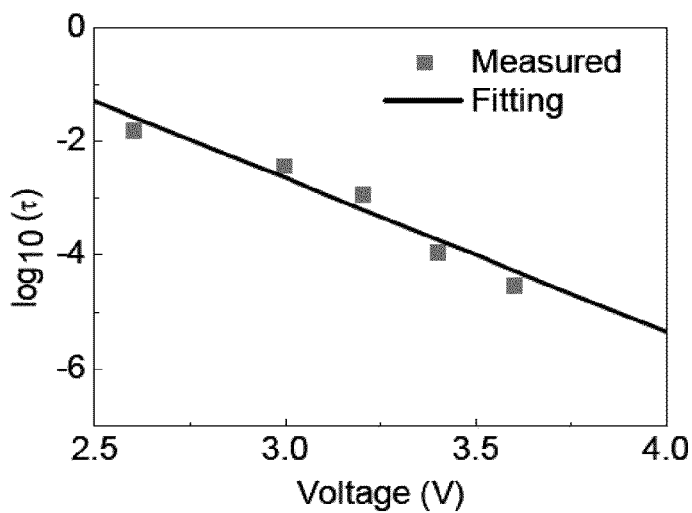
FIG. 2(e) is a graph depicting the relationship between switching time and bias voltage for an a-Si device such as shown in FIG. 1(a)

The histograms in FIGS. 2(a)-(c) can be fitted to Equation 2 using $\tau$ as the only fitting parameter, thereby yielding $\tau$ values of 15.3 ms, 1.2 ms and 0.029 ms, respectively. These graphs show that $\tau$ is a strong function of V and decreases by almost $10^3$ when V is increased by only 1 V. FIG. 2(e) shows the distribution of the measured $\tau$ at 5 different bias voltages along with a fit assuming exponential decay, treating $\tau_0$ and $V_0$ as fitting parameters:

$$\tau(V) = \tau_0 e^{-V/V_0} \quad (3)$$

It is interesting to note the physical meaning of $V_0$ in Equation 3. From FIG. 2(d) and to a first order, $E_a'=E_a-Ed$, where $E_a$ is the activation energy at zero bias, E is the electric field and d is the distance between the Ag trapping sites. If it is assumed that most of the voltage is dropped across the Ag chain and the Ag particles are evenly distributed within the chain then, to a first order $E_a'(V)=E_a-V/2n$, where n is the number of the Ag sites. Equation 3 can then be directly derived from Equation 1, where $\tau_0=1/ve^{E_a/k_B T}$ and $V_0=2nk_B T$. Significantly, the $V_0$ value of 0.155V inferred from the fitting in FIG. 2(e) is very close to that predicted by this simple model, $V_0=2nk_B T \approx 0.156V$, assuming there are 3 Ag sites in the filament (n=3), as suggested by the number of major current steps in the semi-log I-V plot in FIG. 1(c). Equation 3 clearly suggests that the wait time is strongly bias dependent, and that it can be reduced exponentially by increasing the applied bias.

Figure 3B:
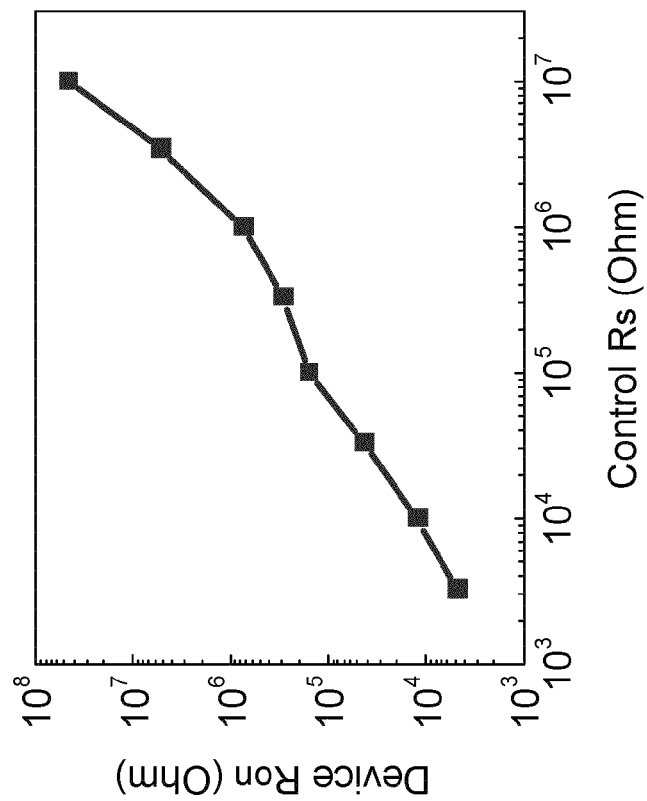
FIG. 3(b) depicts the correlation between the final resistance of the programmed a-Si device and the selected control resistance used to program the device.
Figure 3A:
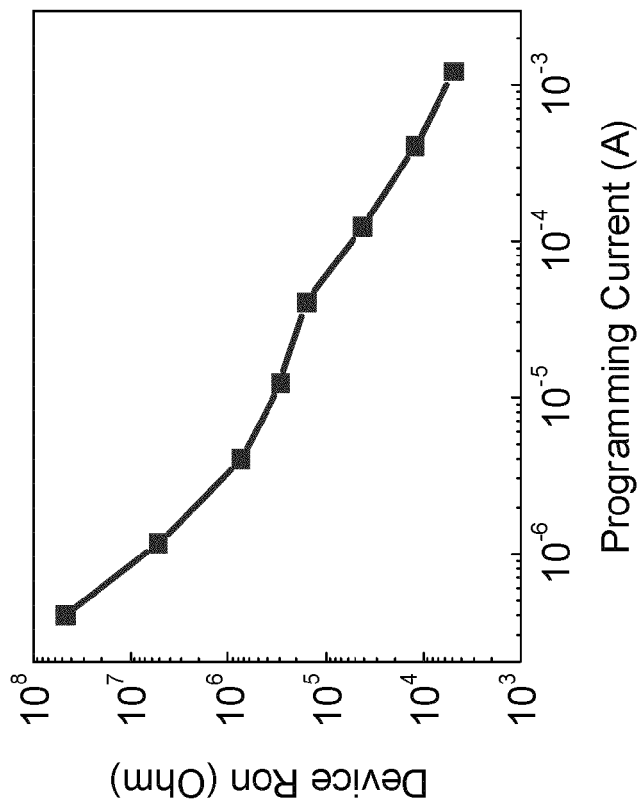
FIG. 3(a) shows the result of programming a typical a-Si device using different series-connected control resistors or different programming current provided by other means.

The bias-dependent switching characteristics have important implications on the device operation. First, the switching essentially does not have a "hard" threshold voltage even though the switching can be very sharp (e.g. FIG. 1c), since there is always a finite probability for switching to occur even at relatively low bias voltages. On the other hand, threshold voltages can be defined for a given programming pulse width. For example, if the threshold is defined as the voltage above which 95% success rate is achieved, then the threshold voltage is 3.3V for a 1 ms pulse, and 5.1V for a 10 ns pulse width. Second, multi-level bit storage can be achieved in these devices by adjusting the external circuit resistance. When a series-resistor is attached to the device, the voltage across it will be reduced after the initial switching, resulting in significantly longer wait time for the subsequent switching events. As a result, partially formed filament can be created if the programming pulse is removed before the subsequent switching events can occur, resulting in intermediate resistance values between the ON and OFF states. FIG. 3a shows the final device resistance obtained on the same device using identical programming pulses but with different series resistor values. The $8=2^3$ different resistance levels obtained on the device suggest that each device as a memory component can store up to 3 bits of information. The device resistance R also correlates well with the resistance $R_S$ of the series resistor, as shown in FIG. 3b, since the voltage divider effect that causes the elongation of the wait time is most pronounced when the device resistance becomes comparable with $R_S$.

FIG. 5(a) shows a schematic diagram illustrating how the multi-level resistance can be used to store a plurality of bits in a same memory cell. In some embodiments, a memory cell 520 is connected in series with an array 525 of resistors 530a-530h (530 in general), and decoding circuitry 535 controls which resistor 530 from the array 525 is connected to the memory cell 520. The resistance R 510 in this case is the resistance due to the non-crystalline or a-Si in the memory cell 520.

In some embodiments, a p-type silicon structure may be vertically stacked between the two electrodes of the device thereby forming a PN diode between the electrodes. The integrated PN diode may then act as a voltage tunable resistor to replace the series control resistor used for achieving multi-bit storage. In such cases, multi-level storage can be achieved with a single PN diode (vs. an array of control resistors 525) in series with the resistive memory device by adjusting an amplitude of a programming pulse.

Figure 5B:
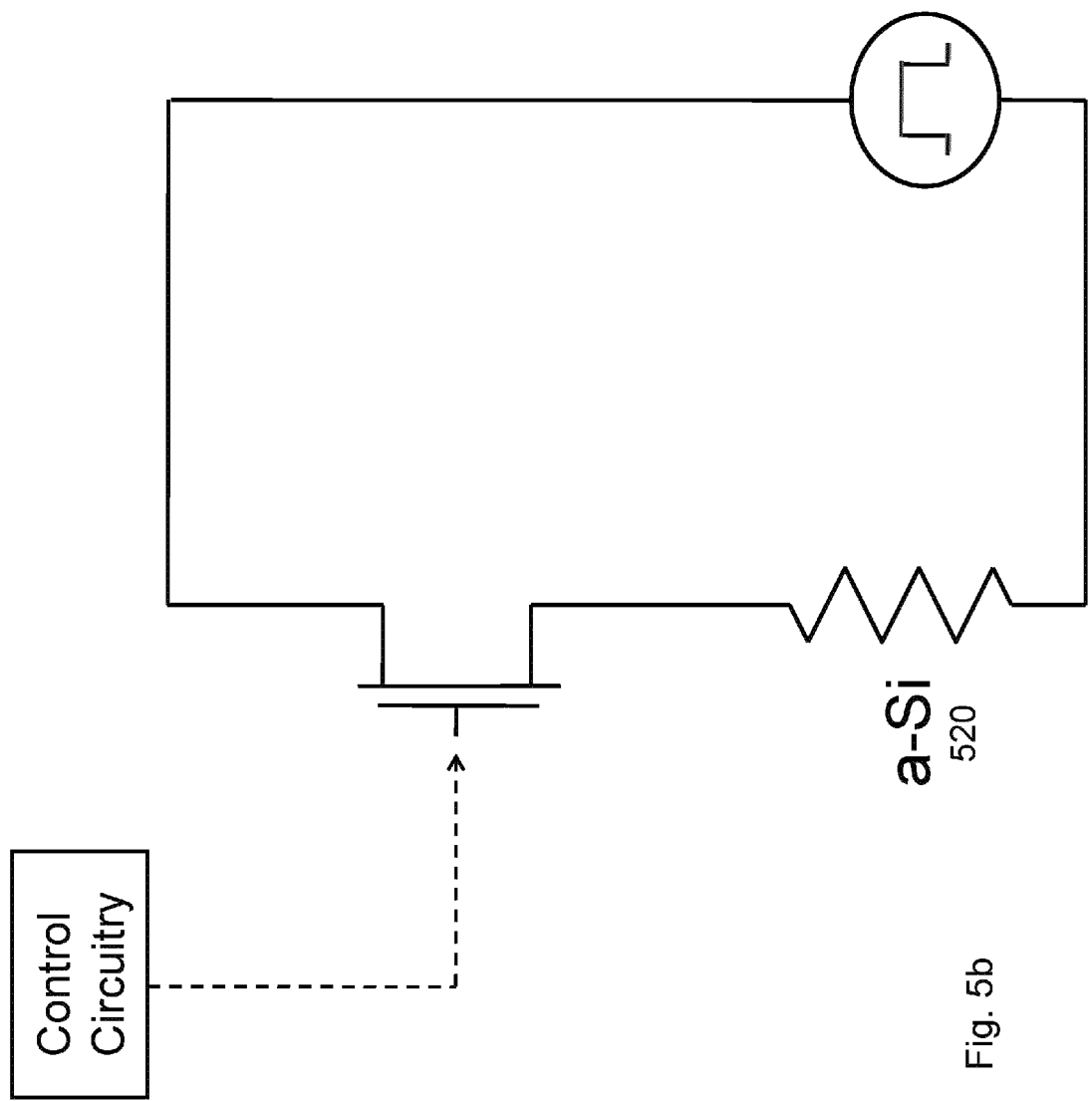
FIG. 5(b) shows a schematic diagram illustrating how a transistor may be used to control the resistance of the memory cell.

In other embodiments, a transistor may be used to control the resistance R 510 of the memory cell, as illustrated in FIG. 5(b). A voltage signal from a control circuit controls the resistance of the transistor which in turn sets the resistance R 510 of the memory cell 520.

Various approaches can be used to implement the selective programming of multi-level numbers into the a-Si device. As used herein, a multi-level number is a number having more than two (binary) levels or values, such as a base-three digit or number, base-four number, etc. Multi-level number storage can be used to store multiple bits of binary information; for example, a four-level a-Si storage cell can store two bits of binary data in a single a-Si cell, and an eight-level cell can store three bits of binary data. When used in a digital circuit device, the memory cell can include a suitable control circuit to program a binary or other number into the a-Si device. Such circuitry is within the level of skill in the art and an exemplary diagram of one such control circuit is shown in FIG. 5. The illustrated control circuit can be used to set the a-Si structure at any one of eight resistance levels by insertion or removal of additional resistance into the circuit in series with the a-Si structure. For this purpose, a decoding circuit can be used to convert three bit binary input data into the corresponding control signals used to switch the control resistors into or out of the circuit. In this way the decoding circuit is operable to adjust the resistance of the a-Si structure to any of a plurality of desired resistance values by setting the total control resistance in series with the a-Si structure to an associated resistance value. As will be appreciated, the control circuit of FIG. 5 is diagrammatic only and specific circuit arrangements for writing, erasing, and reading the resistance value of the a-Si structure will be known to those skilled in the art.

A control circuit such as in FIG. 5 can be used to carry out the various steps discussed above for adjusting the resistance of the a-Si structure. These steps together comprise a method that can be used to adjust the resistance of the a-Si structure between a beginning resistance value and a final resistance value. In general, the method includes the steps of electrically connecting the a-Si structure (which is a first resistive device) in series with a second resistive device and applying a voltage across the series-connected resistive devices. As discussed above, the second resistive device is a control resistance comprising either one or a combination of two or more control resistors or other devices (e.g. transistors or diodes) whose resistance can be controlled through external signals (e.g. voltage). The control resistance is selected (e.g., by the decoding circuit) based on the desired final resistance value for the a-Si structure. Also, as discussed herein, the final resistance value of the a-Si structure can be set at least in part based on the magnitude of the applied voltage, the duration of the applied voltage, or both. Thus, the applying step can comprise setting the final resistance value by applying a voltage of a selected magnitude and duration across the series-connected resistance devices. Furthermore, as noted above, multi-level number storage can be implemented using the a-Si structure such that the final resistance value is one of a plurality of selectable resistance values. For this, the step of electrically connecting the a-Si structure in series with the control resistance further comprises electrically forming the control resistance by selectively inserting or shunting one or more control resistors in series with the a-Si structure based on a chosen one of the selectable resistance values. This again can be done using the decoding circuit of FIG. 5 or using other suitable circuitry that will be apparent to those skilled in the art. To reset the a-Si device back to the beginning resistance value, an opposite-polarity reset voltage is applied to the a-Si structure.

The a-Si structure can be used as a memory cell of a digital non-volatile memory device having a number of a-Si memory cells arranged in an array or other suitable structure. Rather than being used for bit or multi-level number storage, the a-Si structure can be operated via a method that switches it between the ON and OFF states. This can be done by applying a voltage across the a-Si structure, wherein the applied voltage has a magnitude and duration that are selected so as to achieve a predetermined probability of the a-Si device switching from the OFF state to the ON state. The predetermined probability of successful switching can be, for example, 95% or can be any other percentage desired or required for a particular application of the a-Si device.

As indicated above, the successful operation of the a-Si device depends not only on the amplitude, but also on the duration time of the bias. The requirements also depend on whether digital switching (e.g. as single-bit memories) or analog operations (e.g. as interconnects) are desired. For the Poissonian processes discussed above, FIG. 3c plots the probability of exactly one switching event occurring during time t while FIG. 3d plots the probability of at least one switching event occurring during time t. They correspond to the case with no external series resistance and a single switching rate applies to the step-wise filament formation process. It is clear then that the device acts as an excellent digital switch for long-enough programming pulses (e.g., 95% success rate is achieved for $t_{pulse}>3\tau$). On the other hand, for multi-bit storage or analog operations of the switch, the pulse width has to be optimized. For example, $t_{pulse}$ needs to be centered at $\tau$ for the highest probability that only the first switching occurs. Even so the maximum success rate is only ~38%. However, the success rate for multi-bit operations can be significantly improved by the addition of the external series resistance, which dramatically reduces the subsequent switching rates. FIG. 3e plots the probability that only the first switching event will occur in a simplified two-step filament formation process in which two different rates are used:

$$P(t) = \frac{\tau_2}{\tau_1 - \tau_2}(e^{-t/\tau_1} - e^{-t/\tau_2})$$

where $\tau_1$=3.36 μs and $\tau_2$=1.30 s corresponding to the switching rates when the voltages across the device are 4V (before the first switching event and $R \gg R_S$) to 2V (after the first switching event and $R_S=R$) respectively, as a result of the voltage divider effect after the first switching event. A much higher success rate of greater than 99% can now be achieved for $5\tau_1 < t_{pulse} < 0.01\tau_2$ (about 13 ms time margin at 4 V bias) to limit the switching to the 1st event only. In addition, similar exhibited characteristics are expected from other resistive switching devices since many of them involve some sort of activation energy process, e.g. the diffusion of ions and the redox processes.

Figure 4B:
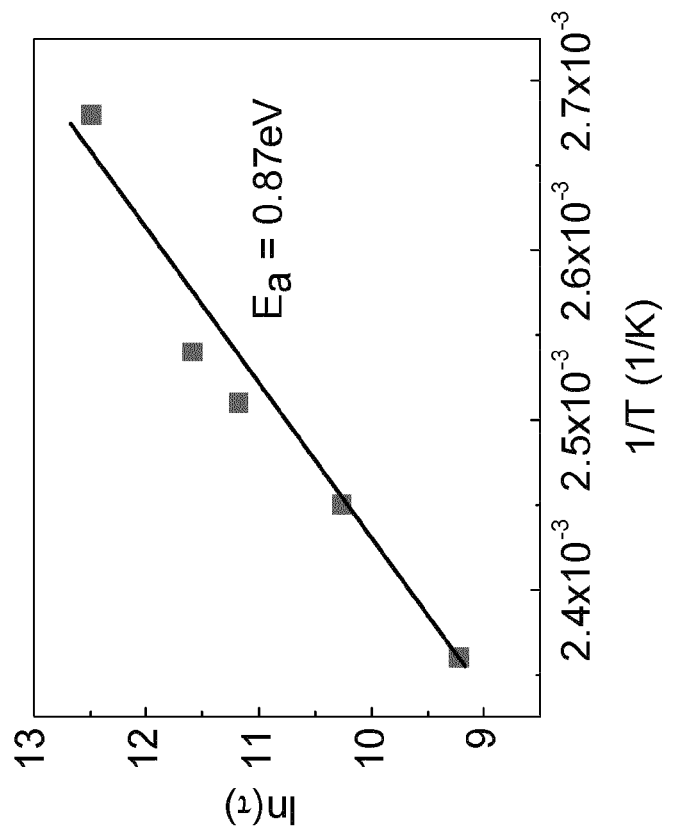
FIG. 4(b) is a graph of the wait time for an ON-to-OFF resistance transition versus temperature.
Figure 4A:
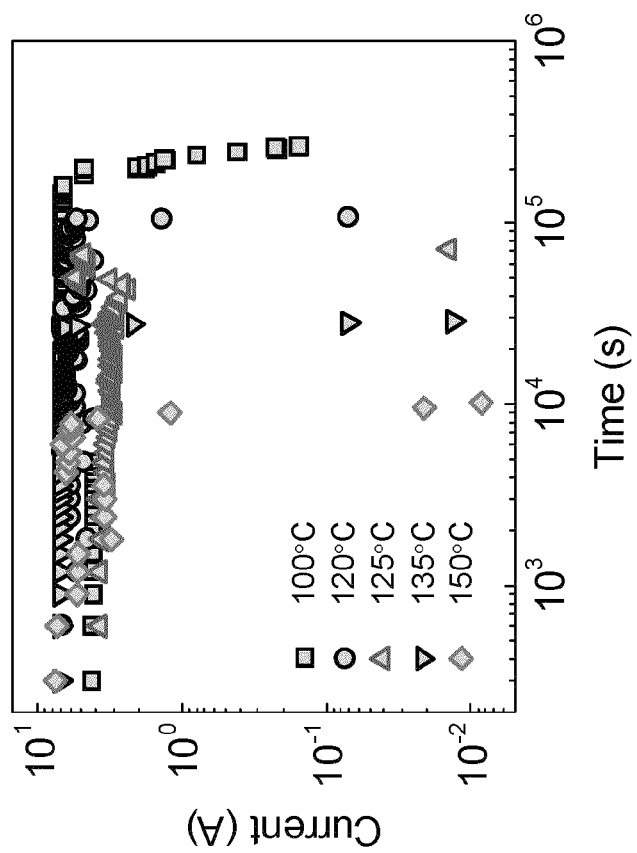
FIG. 4(a) is a plot of the wait time for an ON-to-OFF resistance transition when no bias voltage is applied to an a-Si device such as shown in FIG. 1(a)

The activation energy of the barriers can be extracted from temperature dependence of the wait time from Equation 1. FIG. 4(a) shows the time dependent resistance change at zero-bias at temperatures from 100° C. to 150° C. for a device originally programmed in the ON state. With reference back to FIG. 1(c), the sudden transitions to the OFF state correspond to the retrieval of the Ag filament by the thermally activated hopping of the Ag particle 210 towards the top electrode from the trapping site nearest to the bottom electrode, as verified by the good fitting in the Arrhenius type plot of the wait time t versus $1/k_BT$ that is shown in FIG. 4(b). The activation energy for the ON/OFF transition can be extracted to be 0.87 eV for this device from the slope of the Arrhenius plot and the retention time at room temperature can be estimated to be 6 years from extrapolation.

When incorporated into memory arrays such as described below or when otherwise necessary or desirable for a particular application, the a-Si device can be constructed with an intrinsic diode in the form of a p-n junction. This can be incorporated during fabrication by further including an n-type layer between the p-type poly-Si electrode and the second metal (e.g., platinum) electrode. When used in a memory array of the crossbar type, this construction can be used to prevent cross-talk between adjacent devices since forward conducting current flowing out of one cell through its diode will be blocked by the (now reverse biased) diode of the adjacent cell.

Figure 6A:
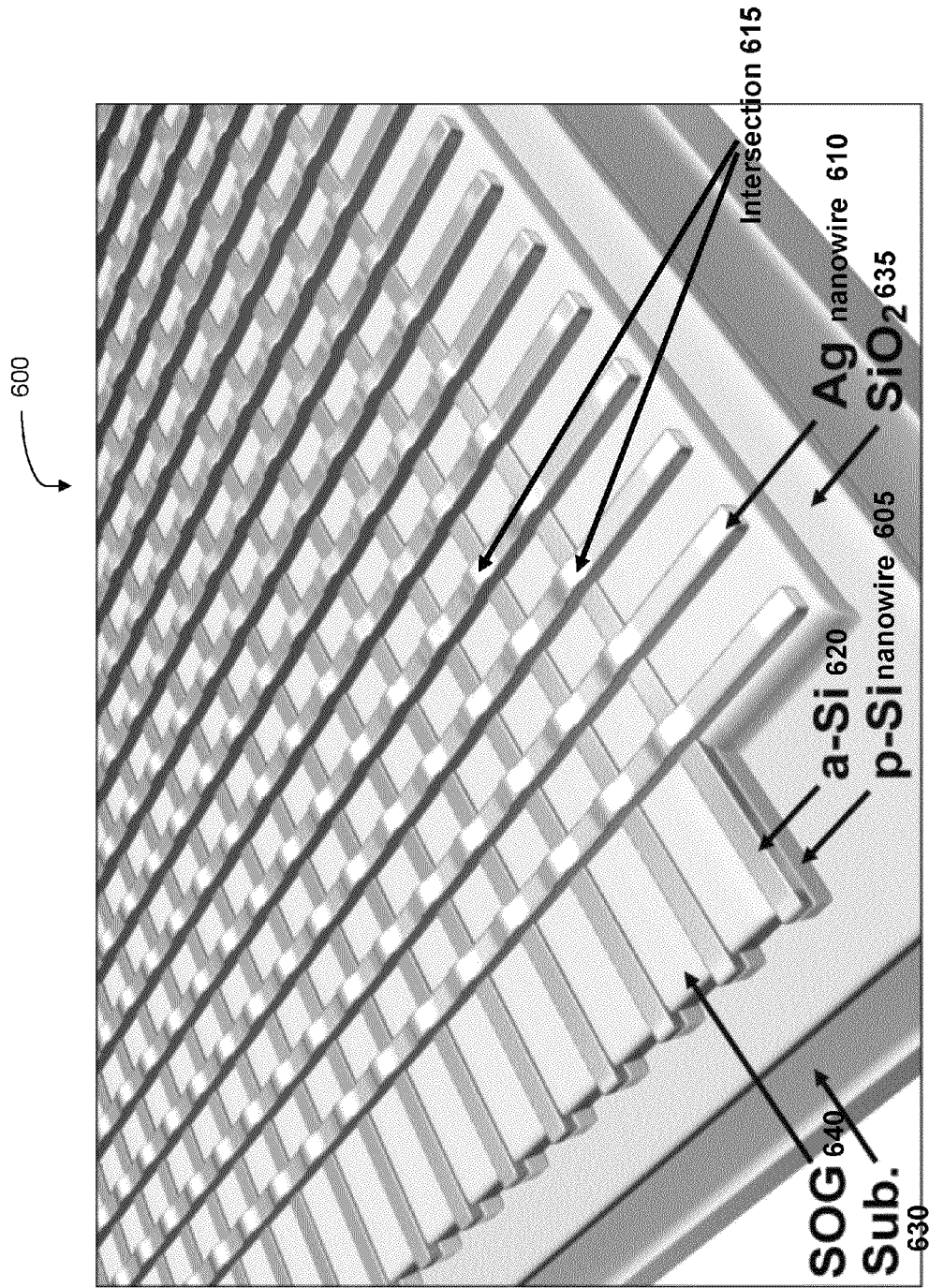
FIGS. 6(a) and 6(b) are schematic diagrams of two embodiments of crossbar memory arrays.

Referring now to FIG. 6a, an embodiment 600 of a non-crystalline or amorphous silicon (a-Si) based crossbar memory array is shown and described. In some embodiments, the crossbar memory includes a parallel array of Boron doped poly-silicon (p-Si) nanowires 605. In other embodiments, silicon nanowires 605 with other acceptor dopants may be used. In still other embodiments, the parallel array may include metallic nanowires. The metallic nanowires may comprise metals with a high voltage threshold for ion migration (at least higher than that of the metallic nanowires of the top electrode), such as nickel (Ni) and platinum (Pt). In some embodiments, the nanowires may have a width and pitch in nanometer scale. For example, the nanowires can have a width of about 36 nm and pitch of about 60 nm. These nanowires serve as the bottom electrodes of a resistive memory cell.

A parallel array of metallic nanowires 610 serve as the top electrodes. The array of metallic nanowires 610 is oriented at an angle with respect to the p-Si nanowire 605 array. The array of metallic nanowires 610 may include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In some embodiments, the array of metallic nanowires 610 are perpendicular (or oriented at a right angle) to the array of p-Si nanowires 605. In other embodiments, the two arrays may be oriented at any angle with respect to one another. The metallic nanowires 610 can have a width and pitch in nanometer scale. For example, the metallic nanowires can have a width of about 60 nm and pitch of about 150 nm.

Figure 6B:
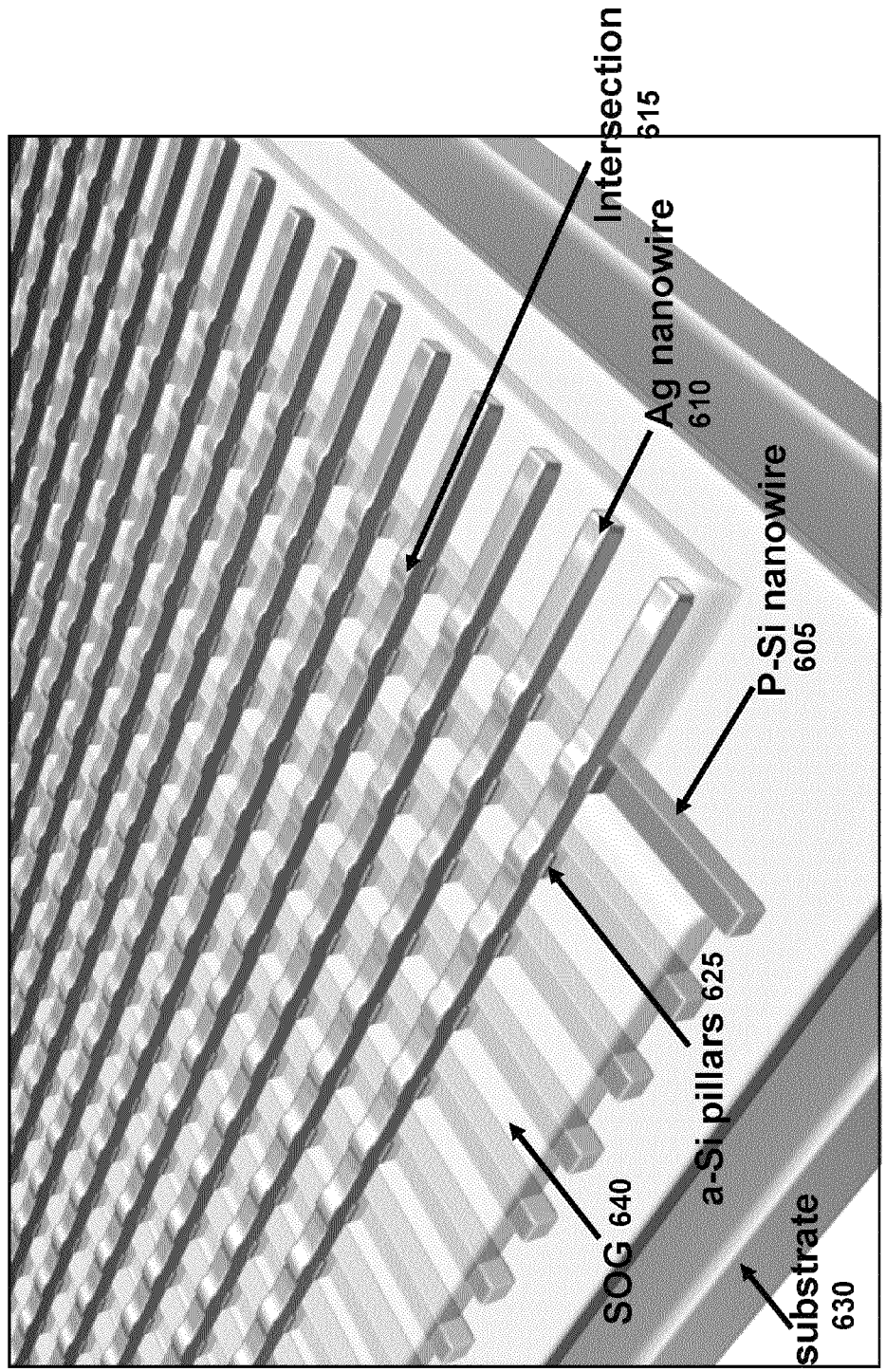

Each intersection point 615 of the two arrays produces a resistive memory cell. The memory cell at each intersection 615 includes two electrodes separated by a structure of amorphous silicon (a-Si) 620 or other non-crystalline silicon. In some embodiments, the a-Si structure is fabricated as nanowires 620 disposed on top of the p-Si nanowires 605 as shown in FIG. 6a. In some embodiments (shown in FIG. 7a), the a-Si nanowires 620 can be the same width or narrower than the p-Si nanowires 605, but can extend the same length as the p-Si nanowires. In other embodiments, the a-Si structure is fabricated as nanoscale pillars 625 disposed between the two arrays at each of their intersection points. In some embodiments, the a-Si nanostructures 625 can have lateral dimensions up to the same dimensions as the overlapping area of the top and nanowires. This is illustrated in FIG. 6b which shows a schematic diagram for another embodiment of a high density amorphous silicon (a-Si) based crossbar memory array. In some embodiments, each memory cell in a crossbar memory array can store a single bit. In other embodiments, the memory cells exhibit multi-level resistance thereby allowing storage of a plurality of bits at each cell.

It should be noted that resistive memory cells can also be fabricated using a metal such as nickel (Ni) or platinum (Pt) in place of p-Si in the bottom electrodes. In one embodiment, an array may comprise one or more Ag/a-Si/Ni memory cell intersections. However, unlike the Ag/a-Si/p-Si structures in which the ON-resistance can be adjusted by tuning the a-Si growth parameters, the Ag/a-Si/Ni devices likely show low $R_{ON}$ and high programming currents. In addition, the endurance of the Ag/a-Si/Ni memory cells are typically lower than the Ag/a-Si/p-Si memory cells. In some embodiments, this is due to mechanical stress induced by the high programming current. A high concentration of trapping sites for Ag near the a-Si/metal interface causes the formation of multiple filaments (or filaments with closely spaced Ag trapping sites) thereby increasing the programming current. It should also be noted that the top and bottom electrodes as described above may be interchanged without departing from the scope of the present application.

The crossbar memory array as described above may be fabricated on a silicon substrate 630. In one embodiment, the substrate includes very pure prime grade silicon. In another embodiment, the silicon substrate may be coated with a thin layer of thermal oxide 635. Silicon dioxide ($SiO_2$) may be used as the thermal oxide 635. In other embodiments, III-V type semiconductor compounds (such as Gallium Arsenide GaAs, Gallium Nitride GaN, Boron Nitride BN etc.) or II-VI type semiconductor compounds (such as Cadmium Selenide, Zinc Telluride etc.) may also be used as the substrate 630. The substrate 630 may also be referred to as a wafer.

Electrodes of the two arrays are insulated from one another, and nanowires within the arrays are insulated from each other, using an insulator material 640. In one embodiment a dielectric material such as Spin-On-Glass (SOG) is used for insulating the two arrays. SOG 640 can be applied in a liquid form and thermally cured. SOG 640 fills narrow cavities and spaces and planarizes surfaces. SOG 640 may comprise one or more of the following materials: a silicate, a phosphosilicate and a siloxane. While SOG 640 is used as an example, it should be noted that other insulator and/or dielectric materials may be used for insulating the two arrays of electrodes.

Figure 7A:
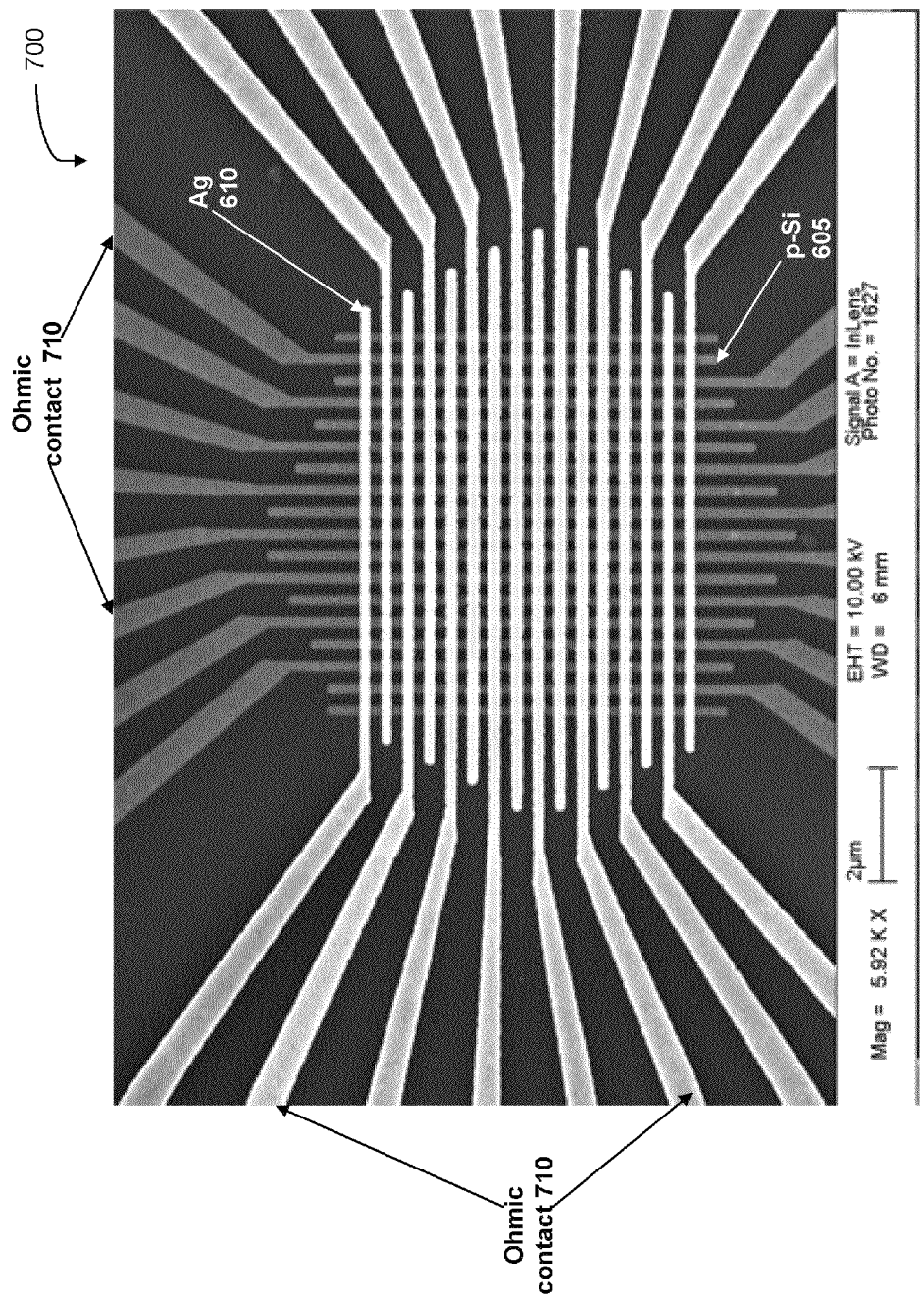
FIG. 7(a) is a scanning electron microscope (SEM) image of a top view of a 16×16 array.

Referring now to FIG. 7a, a scanning electron microscope (SEM) image 700 of a 16×16 crossbar memory with a density of 1.1 Gbits/cm² is shown. It should be noted that FIG. 7a is provided for illustrative purposes and should not be considered limiting. It should be apparent to one of ordinary skill in the art that the dimensions and density of the memory array may be changed without departing from the scope of the present application. The crossbar memory array is connected to one or more circuits via a plurality of wires or ohmic contacts 710. In one embodiment, each nanowire in the two arrays is connected to a separate wire or ohmic contact 710. In another embodiment, a plurality of nanowires may be connected to a common ohmic contact 710. The ohmic contacts 710 may be fabricated on the same substrate 630 on which the memory array is fabricated. The ohmic contacts 710 may be fabricated using any conducting material. In some embodiments, the conducting material used is a metal such as platinum (Pt), nickel (Ni) or palladium (Pd). The ohmic contacts 710 may also include contact pads or pins for facilitating connections with one or more other circuits or parts of circuits.

Figure 7B:
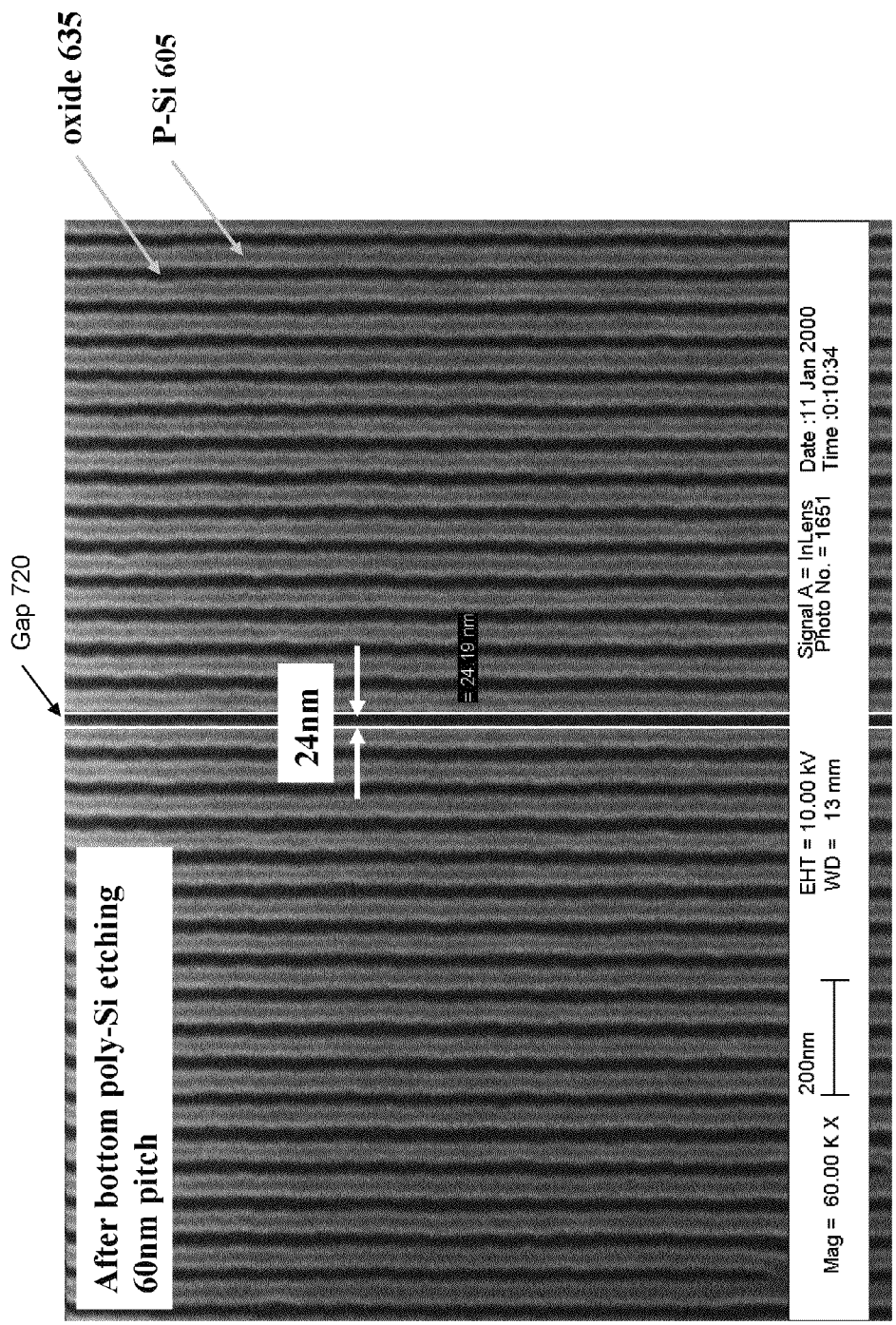
FIG. 7(b) shows an array of p-Si nanowires.

FIG. 7b shows an example how the bottom poly silicon is etched to form the array. In some embodiments, the gaps 720 between the etched poly silicon are reduced to very small dimensions such as less than 25 nm. In some embodiments, the etching of the bottom poly silicon is good for the metal layer in the sense that further processes such as chemical mechanical planarization (CMP) are not required.

Referring again to FIG. 7a, the ohmic contacts 710 are used for applying read/write/erase programming voltage or pulses across the array of electrodes. In one embodiment, the array can be addressed automatically using a group of preset write/erase/read programming pulses without having to adjust the programming signals manually or knowing the state of the memory cells. In other embodiments, the array can be addressed manually by applying programming pulses according to the state of a memory cell.

Figure 8:
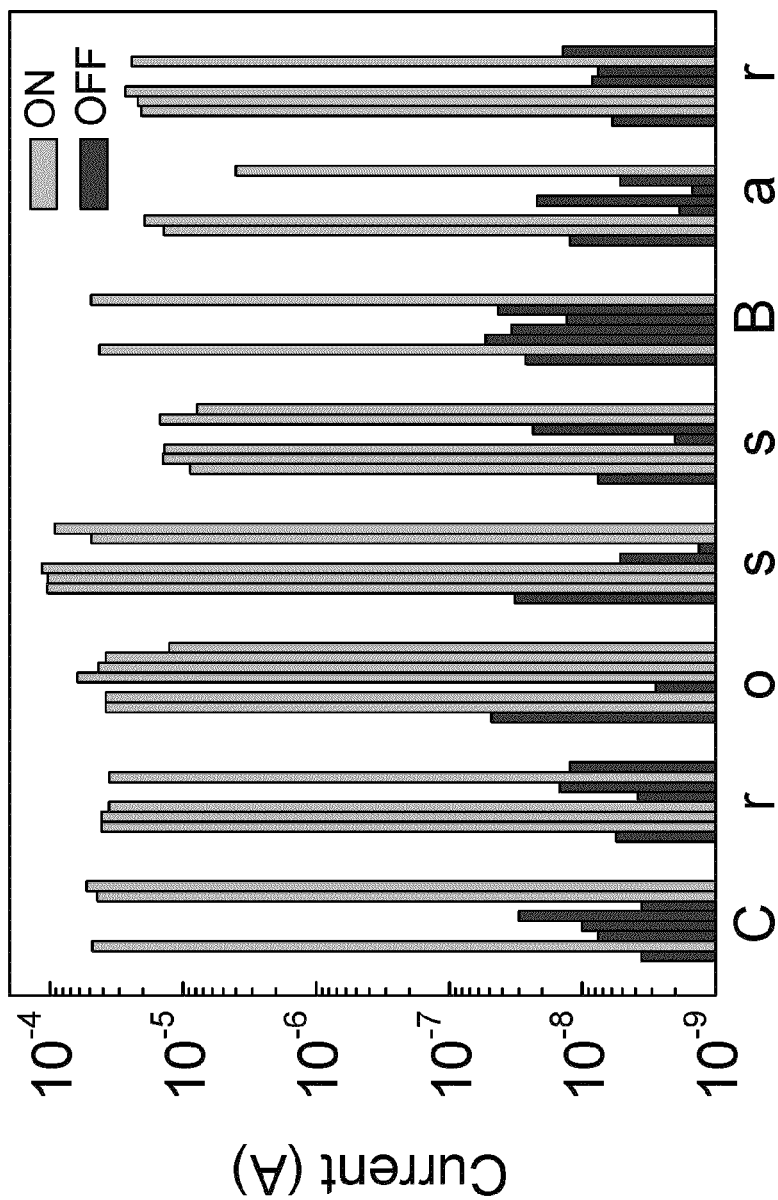
FIG. 8 represents data stored in an 8×8 array corresponding to the word "CrossBar" in ASCII code.

Referring now to FIG. 8, a graphical representation of data stored in an 8×8 array is shown. In this example the word "Crossbar" is represented as 64 bits (8×8), where each letter is represented by an 8-bit ASCII character and written into a single row inside the array. In this example the contacts of the array were made close to the intersections 615 and the width of the bottom p-Si nanowire 605 electrodes were kept large to reduce the series resistance associated with the bottom p-Si nanowire 605 electrodes. In some embodiments, the series resistance problem can be mitigated by adding a metal or silicide layer underneath the p-Si nanowires 605. The incorporation of the metal or silicide layer allows the narrower p-Si nanowires 605 to be used thereby increasing bit density.

Amorphous or non-crystalline (a-Si) based crossbar memory arrays offer many advantages. Besides being compatible with existing CMOS fabrication processes, the large knowledge base accumulated for a-Si thin-film deposition can be used to control the device characteristics. For example, rectifying behavior (diode-like) and non-rectifying (resistor-like) characteristics have been observed in the ON state of the a-Si devices by adjusting the a-Si growth conditions. The rectifying behavior with intrinsic diode characteristics will be desirable in high-density arrays as it reduces crosstalk between adjacent cells. Such a-Si devices are described in U.S. Patent Application Publication No. 2009/0014707 A1 the entire contents of which is hereby incorporated by reference. In addition, a 1D1R (one-diode-one-resistor) structure can be incorporated by the addition of an n-type silicon layer below the p-type silicon nanowire electrode so that a PN junction can be formed in series with the a-Si switch. The cell size in this case will remain at $4F^2$ where F is the smallest feature size (i.e. electrode linewidth in this case) hence maintaining a clear density advantage compared with other approaches that requires a select transistor (e.g. 1T1R structures).

Referring now to FIGS. 9a-9n, crossbar memory arrays at different stages of fabrication are shown and described. In an example embodiment, an acceptor doped p-Si layer 905 and an a-Si layer 910 are deposited on a prime grade $Si/SiO_2$ substrate 915 following the recipe used for single cell devices. The nanowire electrodes are formed using techniques such as E-beam lithography or reactive ion etching. Ohmic contacts 710 to the p-Si nanowire 605 electrodes are fabricated by etching the a-Si layer 910 at the end of each followed by Pt metal deposition. SOG coating, thermal curing and planarization processes are carried out on the crossbar memory arrays. In some embodiments, methods such as ellipsometry are used to monitor the thickness of the SOG during the partial etch. The Ag top nanowire 610 electrodes are patterned by e-beam lithography and lift-off. Contact pad patterns are fabricated by a photolithography process and configured to fit a custom made probe card. In some embodiments, a final SOG coating and e-beam cure process are performed to passivate the Ag nanowire 610 electrodes.

Referring to FIG. 9a, now in greater details, a diagram depicting preprocessing steps to fabricating the crossbar memory array is shown. In some embodiments, the preprocessing includes preparation of the substrate 915. In some embodiments, a silicon wafer is used as a substrate 915. In other embodiments, other semiconductor materials such as III-V and II-VI type semiconductor compounds may be used as the substrate 915. The preprocessing steps may also include fabrication of contact pads or ohmic contacts for connecting the memory array to other circuitry. In some embodiments, prime grade silicon is used as the substrate. In some embodiments, the silicon substrate is coated with a layer of dielectric 910, e.g., an oxide, e.g., a thermal oxide such as $SiO_2$. The thickness of the $SiO_2$ layer 910 may be in the range of a few hundred nanometers. A buffered hydrofluoric acid (BHF) dip may be used for etching $SiO_2$ on the substrate.

In some embodiments, a layer of poly-silicon (p-Si) 905 is deposited on the substrate. The p-Si is doped with acceptors such as Boron (B) or Aluminium (Al). The acceptor doped p-Si may be deposited on the substrate using chemical vapor deposition (CVD) techniques. In some embodiments, the initial thickness of the P—Si layer 905 may be reduced due to the doping process. This is due to the consumption of Si during the doping. For example, the initial P—Si layer 905 thickness may be 120 nm which is reduced to approximately 65 nm after the doping. In some embodiments, the doping time is controlled to get a desired thickness of the P—Si layer 905. In one embodiment a low pressure chemical vapor deposition (LPCVD) technique may be used for deposition of the acceptor doped Si. However, it should be apparent to one of ordinary skill in the art that other vapor deposition techniques may also be used. Examples of such techniques include but are not limited to atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (AL-CVD) or atomic layer epitaxy, hybrid physical-chemical vapor deposition (HPCVD), hot wire CVD (HWCVD), direct liquid injection CVD (DLICVD) and vapor phase epitaxy (VPE).

Referring to FIG. 9b, contact pads and traces from the contact pads to the ohmic contacts with the p-Si nanowires are fabricated on the p-Si layer 905. Photolithography and lift-off techniques may be used for depositing one or more metallic contact pads 920. In some embodiments, the contact pads 920 may include a combination of nickel (Ni) and palladium (Pd) Ni/Pd. In one embodiment, fabrication of the contact pads 920 result in defining a region 925 for fabrication of the crossbar array.

Referring to FIG. 9c a further step in fabrication of the crossbar memory array is shown. This step may include deposition of one or more layers 930 of non-crystalline silicon, e.g., amorphous silicon (a-Si). Specifically, a layer 930 of a-Si can be deposited over the p-Si layer 905 (at this point the p-Si not yet patterned in the area that will become the array).

Referring to FIG. 9d, one or more of E-beam lithography, Ni deposition and lift off techniques are used to provide a mask for patterning of the underlying a-Si layer 930 and p-Si layer 905. In some embodiments, a sacrificial lift off layer is deposited on the a-Si layer 905, the lift-off layer is patterned, e.g., using E-beam lithography, and a sacrificial masking layer, e.g., of Ni, is deposited over the lift-off layer. The sacrificial lift-off layer is removed along with portions of the sacrificial masking layer on it, leaving the deposited and patterned mask 935, e.g., of Ni on the a-Si 930.

Referring to FIG. 9e, the patterned Ni 935 (which is a negative pattern of the desired array of nanowires of the a-Si and p-Si) is then used as a mask for an etching step, e.g., reactive ion etching (RIE), that removes unmasked portions of both the a-Si 930 and p-Si 905 layers.

Referring to FIG. 9f, the Ni can be removed after a a-Si/p-Si etch. The Pd and Si are not affected in the Ni removal process. Removing Ni from Ni/Pd improves the contact properties of the ohmic contacts or contact pads since the Ni is damaged during the a-Si deposition and a-Si/p-Si etching steps. Removal of Ni from the a-Si/p-Si nanowires creates the array of a-Si/p-Si nanowires 938.

Referring to FIG. 9g, the step of depositing spin-on-glass (SOG) 940 is described. SOG 940 can be deposited as a liquid form via spin coating. Thus, the SOG 940 fills the gaps between and covers the parallel nanowires. SOG 940 can act as a solvent and react with the metallic contacts thereby forming insulating layers. Such insulating layers are not easily removed and hence degrade the contact pads or ohmic contacts. In one embodiment, inert metal 945 such as gold (Au) is deposited on at least a part of the metallic contacts to minimize reactions with the SOG. 940. The SOG 940 is deposited on the a-Si/p-Si nanowire arrays 938. The deposited SOG 940 is thermally cured or baked at given temperatures and for given time periods. In one embodiment, the deposited SOG 940 is baked or cured in vacuum. In some embodiments, the SOG 940 is pre-baked at a given temperature for a given time and then baked at another temperature for some more time. For example, the SOG 940 may be pre-baked for 10 minutes at 105 degree centigrade and then baked for an hour at 300 degree centigrade. In some embodiments, the baking is done in the presence of nitrogen gas. In one embodiment, the thickness of the SOG layer 940 is controlled via a global thinning process such as RIE or chemical-mechanical planarzation (CMP). In another embodiment, such as shown in FIG. 9h, lift off techniques may be used for depositing gold 945 on the metallic contacts prior to depositing SOG 940.

Figure 9I:
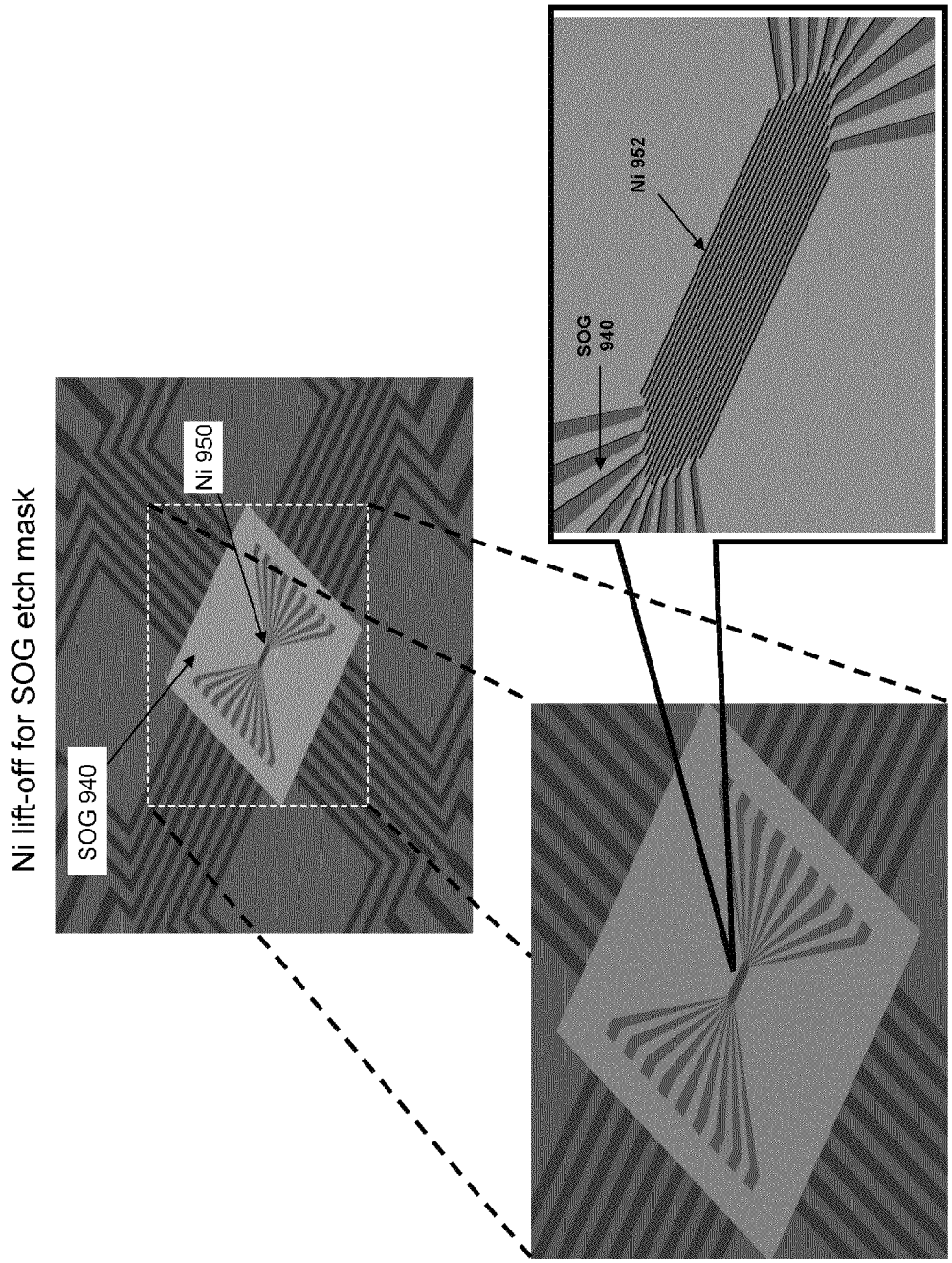
FIG. 9(i) illustrates a result of a step of fabricating a mask according to embodiments of the present invention.

Referring now to FIG. 9i, fabrication of a Ni mask 950 for SOG 940 etching is shown. The Ni mask 950 is used for partially etching the SOG surface 940 in preparation of fabricating the array of top electrodes of the crossbar memory array. In some embodiments, a sacrificial lift off layer is deposited on the SOG 940, the lift-off layer is patterned, e.g., using E-beam lithography, and a sacrificial masking layer 950, e.g., of Ni, is deposited over the lift-off layer. The sacrificial lift-off layer is removed along with portions of the sacrificial masking layer 950 on it, leaving the deposited and patterned Ni on the SOG 940. The patterned Ni 952 (which has a negative pattern of the desired top electrode nanowires) is then used as a mask for etching the SOG 940.

Figure 9K:
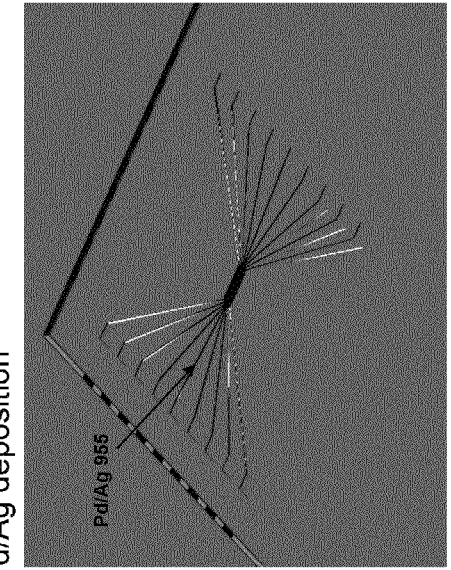
FIG. 9(k) illustrates a result of a step of depositing one or more layers of material according to embodiments of the present invention.
Figure 9J:
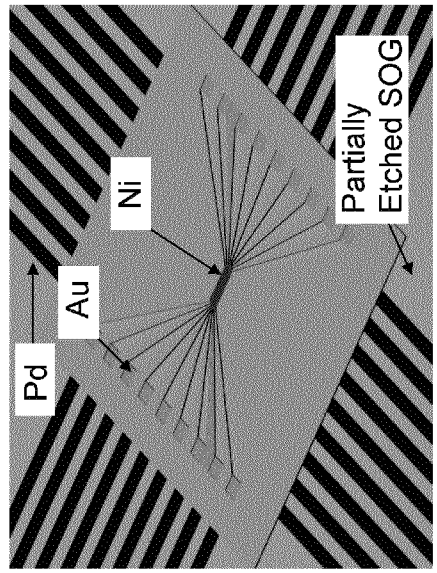
FIG. 9(j) illustrates a result of a step of etching one or more layers of material according to embodiments of the present invention.
Figure 9L:
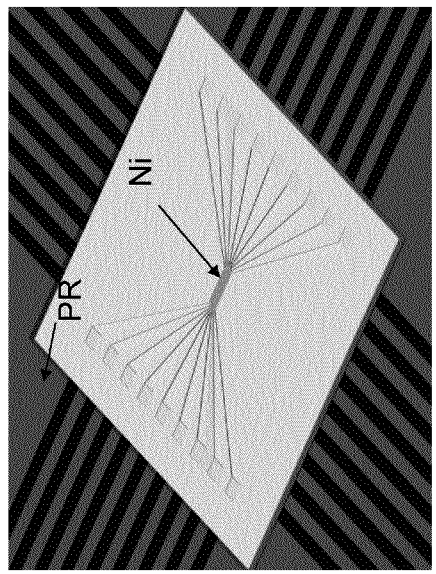
FIG. 9(l) illustrates a result of a step of depositing one or more layers of material according to embodiments of the present invention.

FIG. 9j shows the step of SOG etching and FIG. 9k shows the deposition of Pd/Ag 955 on the etched SOG surface 940. In some embodiments, a two-step lift-off is employed to fabricate the array of Pd/Ag nanowires. In such embodiments, such as shown in FIG. 9L, a sacrificial photoresist layer is deposited over the patterned Ni 952, then photolithographically defined. The photoresist is completely removed inside the crossbar area, and outside the crossbar area the photoresist is patterned with a negative pattern of the desired metallic nanowires. A layer of filament-forming ion-supplying metal, e.g., Ag, is deposited. In addition, a passivation layer can be deposited over the metal layer. In one embodiment, palladium (Pd) is used over the Ag nanowires for passivation of the Ag nanowires. Since the photoresist is removed in the crossbar region, the Ag layer directly contacts the sacrificial Ni mask in this region. In addition, the Ag layer extends through the apertures in the SOG (corresponding to the apertures in the Ni mask) to contact the a-Si layer at the locations where the resistive memory cells will be formed.

In some embodiments, fabrication of the top electrode nanowires also involves the steps of photoresist removal and a global Pd/Ag lift-off. Thus, in a first lift-off process, the sacrificial lift-off layer is removed along with portions of the metal and passivation layers on it, leaving the deposited metal and passivation layers in the crossbar region and defining wires of Ag layer outside the crossbar region. These steps are illustrated in FIGS. 9m and 9n. After the Pd/Ag lift-off, in a second lift-off process, the Ni is removed from the crossbar region along with portions of the metal and passivation layers on it, thereby defining the top electrode nanowires in the crossbar region. FIG. 9n depicts two perpendicular sets of nanowires. Even though the second set and the corresponding contact pads are not visible in the main diagram, the features are shown in the magnified portion of the crossbar array.

Figure 10:
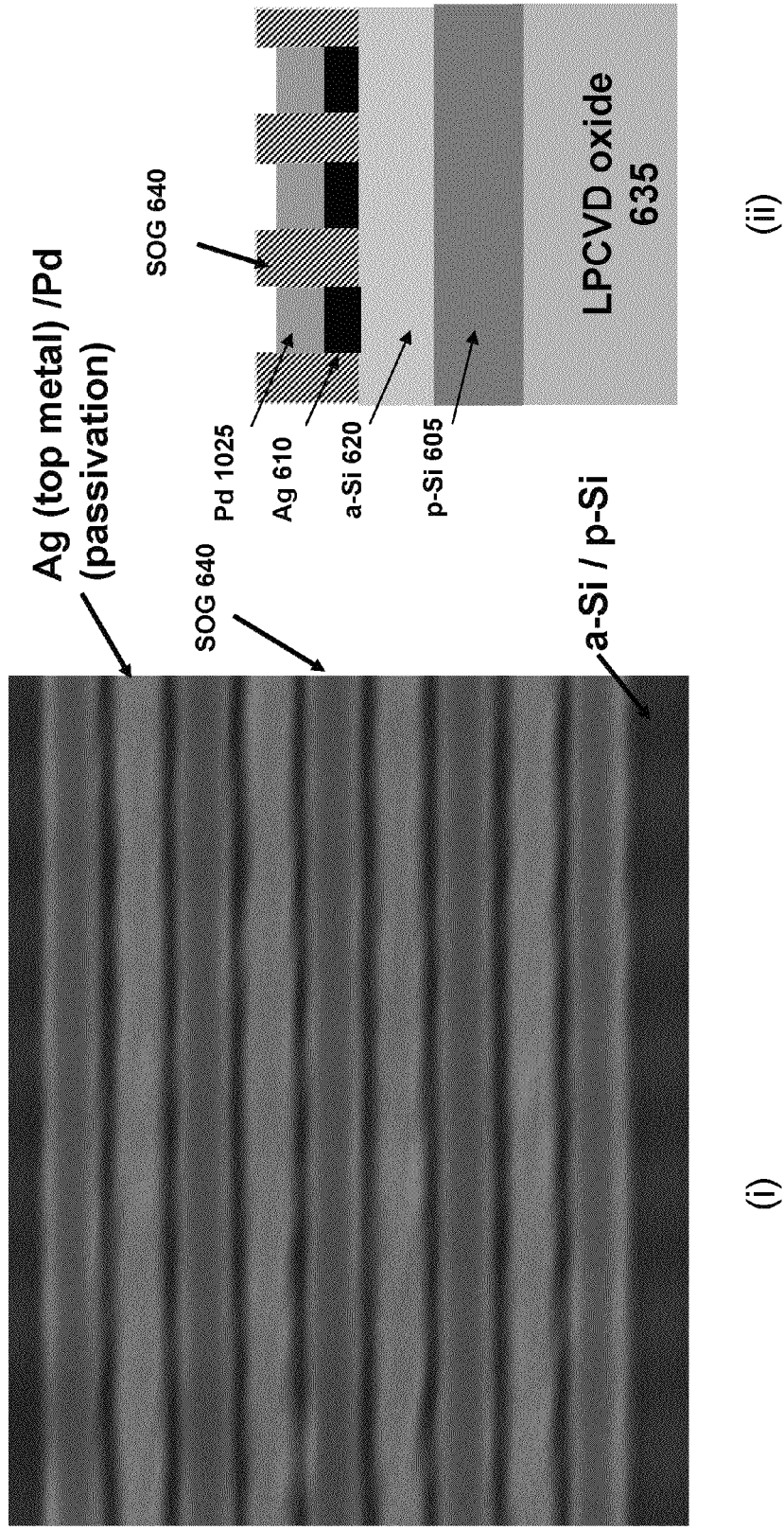
FIG. 10 depicts a top view and a schematic cross sectional view of a crossbar memory array.

Referring now to FIG. 10(i) and FIG. 10(ii), a top view and a cross sectional view, respectively, of the crossbar memory array 600 is shown. It should be noted that this is an example embodiment of the fabricated memory array and should not be considered as limiting. The present example corresponds to a 60 nm linewidth and a 150 nm pitch. However, the linewidth, pitch and other attributes of the memory array may vary without departing from the scope of the present application. The cross sectional view depicts the case when the a-Si 620 structure is in a form of nanowires deposited on top of p-Si nanowires 605. In other example embodiments, the a-Si nanowires 620 may be replaced by nanoscale a-Si pillars at the intersections of the p-Si 605 and Ag nanowires 610 as shown in FIG. 6b. In some embodiments, the top metal such as Ag 610 is passivated using Pd 1025 as shown in FIG. 10(ii).

Figure 11E:
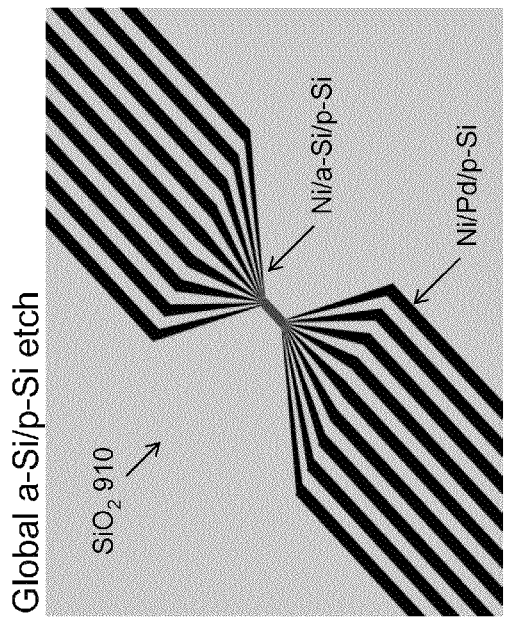
FIG. 11(e) illustrates a result of a step of etching one or more layers of material according to embodiments of the present invention.

Referring now to FIGS. 11a-11i, another embodiment of a method of forming a crossbar memory array at different stages of fabrication are shown and described. Referring to FIG. 11a, a diagram depicting preprocessing steps to fabricating the crossbar memory array is shown. In some embodiments, the preprocessing includes preparation of the substrate 915. Such preprocessing may be substantially same as mentioned with respect to FIG. 11a.

Referring to FIG. 11b, one set of contact pads and traces from the contact pads to the ohmic contacts with the p-Si nanowires are fabricated on the p-Si layer 905 (fabrication of the other set of contact pads and traces for contact with the AG nanowires can occur later in the process). In some embodiments, the contact pads and traces include a combination of nickel (Ni) and palladium (Pd) Ni/Pd. Fabrication of the contact pads result in defining a region 925 for fabrication of the crossbar array.

Referring to FIG. 11c, a further step in fabrication of the crossbar memory array is shown. This step may include deposition of one or more layers 930 of non-crystalline silicon, e.g., amorphous silicon (a-Si). Specifically, a layer 930 of a-Si can be deposited over the p-Si layer 905 (at this point the p-Si not yet patterned in the area that will become the array).

Referring to FIG. 11d, one or more of E-beam lithography, Ni deposition and lift off techniques are used to provide a mask for patterning of the underlying a-Si layer 930 and p-Si layer 905. In some embodiments, a sacrificial lift off layer is deposited on the a-Si layer 905, the lift-off layer is patterned, e.g., using E-beam lithography, and a sacrificial masking layer, e.g., of Ni, is deposited over the lift-off layer. The sacrificial lift-off layer is removed along with portions of the sacrificial masking layer on it, leaving the deposited and patterned mask 935, e.g., of Ni on the a-Si 930.

Referring to FIG. 11e, the patterned Ni (which is a negative pattern of the desired array of nanowires of the a-Si and p-Si) is then used as a mask for an etching step, e.g., reactive ion etching (RIE), that removes unmasked portions of both the a-Si 930 and p-Si 905 layers.

Figure 11F:
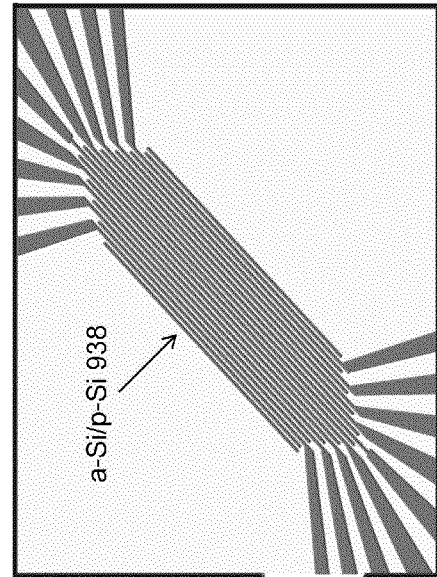
FIG. 11(f) illustrates a result of a step of removing a mask layer according to embodiments of the present invention.
Figure 11F:
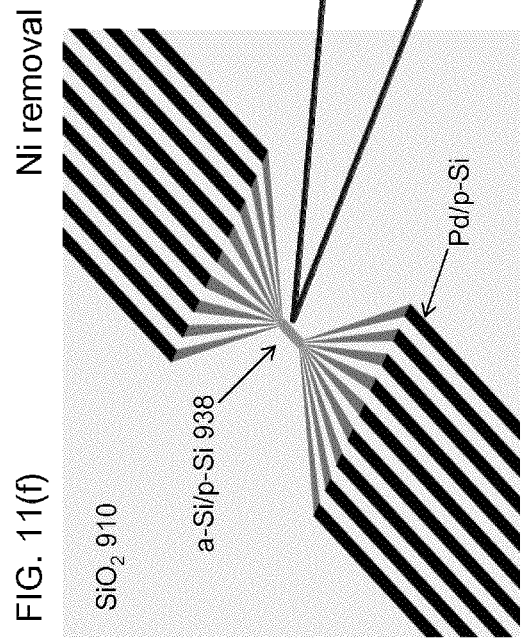

Referring to FIG. 11f, the Ni can be removed after a a-Si/p-Si etch. The Pd and Si are not affected in the Ni removal process. Removing Ni from Ni/Pd improves the contact properties of the ohmic contacts or contact pads since the Ni is damaged during the a-Si deposition and a-Si/p-Si etching steps. Removal of Ni from the a-Si/p-Si nanowires creates the array of a-Si/p-Si nanowires 938.

Figure 11G:
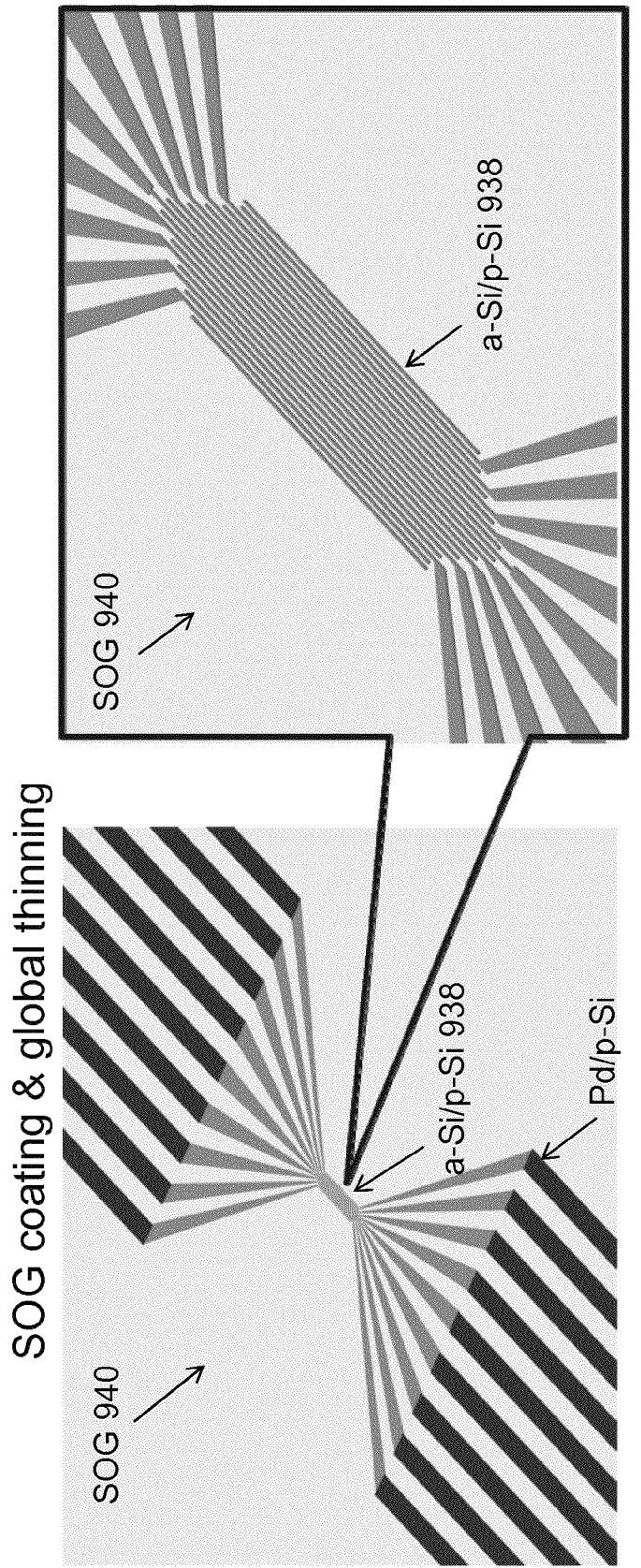
FIG. 11(g) illustrates a result of a step of depositing one or more layers of material according to embodiments of the present invention.

Referring to FIG. 11g, the step of depositing spin-on-glass (SOG) 940 is described. SOG 940 can be deposited as a liquid form via spin coating. Thus, the SOG 940 fills the gaps between and covers the parallel nanowires. SOG 940 can act as a solvent and react with the metallic contacts thereby forming insulating layers. Such insulating layers are not easily removed and hence degrade the contact pads or ohmic contacts. The SOG 940 is deposited on the a-Si/p-Si nanowire arrays 938. The deposited SOG 940 is thermally cured or baked at given temperatures and for given time periods. In one embodiment, the deposited SOG 940 is baked or cured in vacuum. In some embodiments, the SOG 940 is pre-baked at a given temperature for a given time and then baked at another temperature for some more time. For example, the SOG 940 may be pre-baked for 10 minutes at 105 degree centigrade and then baked for an hour at 300 degree centigrade. In some embodiments, the baking is done in the presence of nitrogen gas. In one embodiment, the thickness of the SOG layer 940 is controlled via a global thinning process such as RIE or chemical-mechanical planarzation (CMP).

Figure 11H:
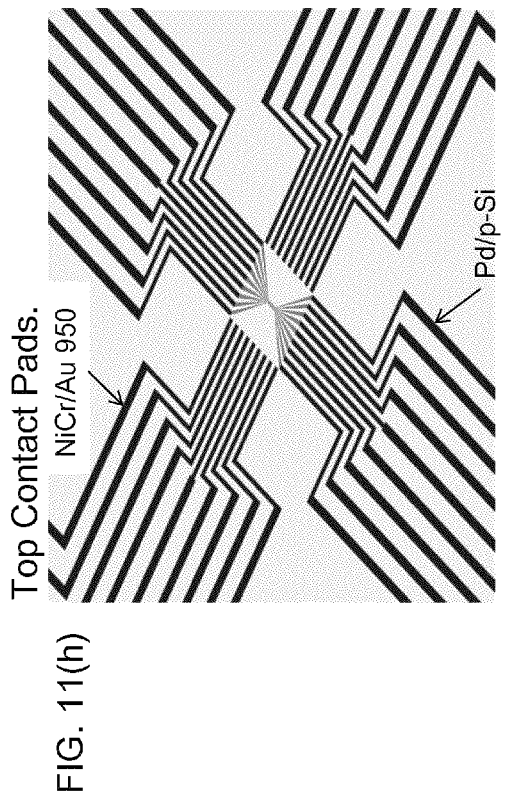
FIG. 11(h) illustrates a result of a step of patterning one or more layers of material according to embodiments of the present invention.
Figure 11H:
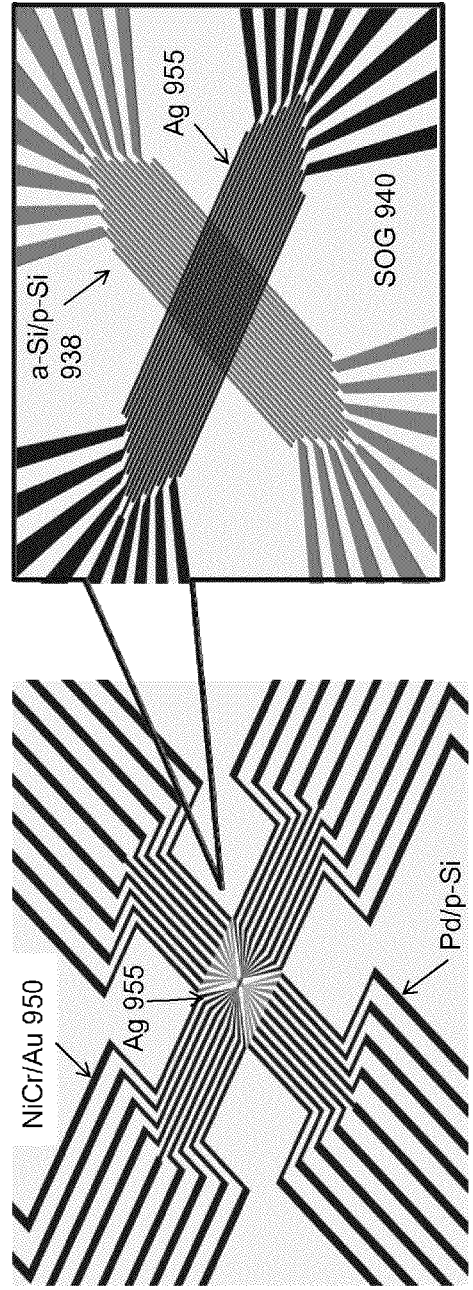

FIG. 11h shows contact pads 950 for Ag nanowires that are fabricated on the SOG layer 940. Photolithography and lift-off technique may be used for depositing one or more metallic contact pads 950. In some embodiments, the contact pads 950 may include a combination of nichrome (NiCr) and gold (Au). In one embodiment, fabrication of contact pads 950, along with the Pd contact pads, demarcates the region 925 for fabrication of the crossbar array.

FIG. 11i shows fabrication of top electrodes of the crossbar memory array. In some embodiments, a layer of filament forming ion supplying metal, e.g., Ag, is patterned using E-beam lithography combined with conventional lift-off process. More particularly, a lift-off layer can be deposited over the SOG 940, patterned using E-beam lithograph (with the negative pattern of the Ag nanowires), the ion supply metal can be deposited over the lift-off layer, and the lift-off layer removed so that only the patterned ion supplying metal remains. In addition, the Ag layer extends to existing contact pads for top electrodes. In one embodiments, palladium (Pd) is used over the Ag nanowires for passivation of the Ag nanowires.

A number of embodiments have been described. Nevertheless, it will be understood that various modifications may be made without departing from the spirit and scope of the invention. For example, the ordering of layers on the substrate could be reversed, with the metallic nanowires forming the bottom electrodes and the nickel (Ni) or platinum (Pt) or poly-Si nanowires forming the top electrodes. Accordingly, other embodiments are within the scope of the following claims.

The invention claimed is:

1. A method for a crossbar memory array having a first plurality of metallic nanowires, a second plurality of metallic nanowires, and a plurality of resistive memory devices electrically disposed between the first plurality of metallic nanowires and the second plurality of metallic nanowires, the method comprising:
applying with a control circuit a voltage to a gate of a first transistor;
coupling a source of the first transistor to a drain of the first transistor in response to the voltage applied to the gate to thereby cause a first voltage to be applied across a first metallic nanowire from the first plurality of metallic nanowires, a second metallic nanowire from the second plurality of metallic nanowires, and a resistive memory device from the plurality of resistive memory devices, wherein the resistive memory device comprises a layer of resistive switching material contacting the first metallic nanowire, and a layer of conductive silicon bearing material having a first surface contacting the layer of resistive switching material and having a second surface contacting the second metallic nanowire;
supplying a plurality of metallic particles from the first metallic nanowire to the layer of resistive switching material in response to the first voltage being applied, wherein metallic particles from the plurality of metallic particles are supplied to a plurality of defect sites within the layer of resistive switching material in response to the first voltage;
removing with the control circuit the voltage from the gate of the first transistor;
decoupling the source of the first transistor to the drain of the first transistor in response to the first voltage being removed from the gate to thereby cause the first voltage to be removed from across the first metallic nanowire, the second metallic nanowire, and the resistive memory device;
wherein the plurality of metallic particles become trapped in the plurality of defect sites within the layer of resistive switching material in response to the first voltage being removed;
wherein the plurality of metallic particles form a conductive filament within the layer of resistive switching material; and
wherein a first resistance of the resistive memory device is characterized by a first tunneling resistance between the layer of conductive silicon bearing material and the conductive filament.

2. The method of claim 1 wherein the plurality of metallic particles comprise particles selected from a group consisting of: silver particles, gold particles, nickel particles, aluminum particles, chromium particles.

3. The method of claim 1 wherein the resistive switching material is selected from a group consisting of: amorphous silicon-bearing material, and non-crystalline silicon-bearing material.

4. The method of claim 1 wherein the conductive silicon bearing material is selected from a group consisting of: a p-type doped polycrystalline silicon-bearing material and a p-type polysilicon.

5. The method of claim 1 further comprising:
applying a second voltage across the first metallic nanowire, the second metallic nanowire, and the resistive memory device to thereby induce a current flow through the resistive memory device, wherein the current flow is dependent upon the first tunneling resistance;
wherein the second voltage is a read voltage; and
wherein metallic particles from the plurality of metallic particles trapped in the plurality of defect sites within the layer of resistive switching material remain trapped while the second voltage is applied across the first metallic nanowire, the resistive memory device, and the second metallic nanowire.

6. The method of claim 1:
wherein a current flows across the first metallic nanowire, the second metallic nanowire and the resistive memory device in response to the first voltage, and
wherein the current flow is less than about 20 uA.

7. The method of claim 1 wherein the first tunneling resistance is associated with a tunneling resistance between a metallic particle of the conductive filament and the layer of conductive silicon bearing material.

8. The method of claim 1 further comprising:
applying a third voltage across the first metallic nanowire, the second metallic nanowire, and the resistive memory device to thereby cause metallic particles from the plurality of metal particles trapped in the plurality of defect sites within the layer of resistive switching material to migrate in response to the third voltage;
wherein the third voltage is an erase voltage; and
wherein the metallic particles migrate towards the first metallic nanowire.

9. The method of claim 8 wherein the third voltage has an opposite polarity from a polarity of the first voltage.

10. The method of claim 1 further comprising:
selecting the first transistor from a plurality of transistors comprising the first transistor and a second transistor;
wherein the first transistor is associated with the first tunneling resistance for the resistive memory device; and
wherein the second transistor is associated with a second tunneling resistance for the resistive memory device.

11. A method for a crossbar memory array having a first plurality of metallic electrodes, a second plurality of electrodes, and a plurality of resistive memory devices electrically disposed between the first plurality of metallic electrodes and the second plurality of electrodes, the method comprising:
applying with a control circuit a voltage to a gate of a first transistor; and
coupling a source of the first transistor to a drain of the first transistor in response to the voltage applied to the gate to thereby cause a read voltage to be applied across a first metallic electrode from the first plurality of metallic electrodes, a second electrode from the second plurality of electrodes, and a resistive memory device from the plurality of resistive memory devices, and to thereby induce a current flow through the resistive memory device, wherein the current flow is dependent upon a first tunneling resistance of the resistive memory device, wherein the resistive memory device comprises a layer of resistive switching material having a first surface contacting the first metallic electrode and a second surface contacting the second electrode;
wherein metallic particles from a plurality of metallic particles from the first metallic electrode are trapped in a plurality of defect sites within the layer of resistive switching material;
wherein the plurality of metallic particles form a conductive filament within the layer of resistive switching material;
wherein the first tunneling resistance is characterized by a tunneling resistance associated with the conductive filament within the layer of resistive switching material; and
wherein the metallic particles trapped in the plurality of defect sites within the layer of resistive switching material remain trapped while the read voltage is applied across the first metallic electrode, the resistive memory device, and the second metallic electrode.

12. The method of claim 11 wherein the plurality of metallic particles comprise particles selected from a group consisting of: silver particles, gold particles, nickel particles, aluminum particles, chromium particles.

13. The method of claim 11 wherein the resistive switching material is selected from a group consisting of: amorphous silicon-bearing material, and non-crystalline silicon.

14. The method of claim 11 wherein the second plurality of electrodes comprise a conductive silicon bearing material selected from a group consisting of: a p-type doped polycrystalline silicon-bearing material and a p-type polysilicon.

15. The method of claim 11 wherein the second plurality of electrodes also comprises a conductive metallic material coupled to the conductive silicon bearing material.

16. The method of claim 11 wherein the current flow is within a range of about 20×10e-6 amps to about 10e-4 amps.

17. The method of claim 11 further comprising:
applying an erase voltage across the first metallic electrode, the second electrode, and the resistive memory device to thereby cause metallic particles from the plurality of metal particles trapped in the plurality of defect sites within the layer of resistive switching material to migrate in response to the third voltage;
wherein the metallic particles migrate towards the first metallic electrode and form a modified conductive filament; and
wherein a second tunneling resistance is characterized by a tunneling resistance associated with the modified conductive filament within the layer of resistive switching material.

18. The method of claim 16 wherein the erase voltage has an opposite polarity from a polarity of the read voltage.

19. The method of claim 16 wherein a ratio between the second tunneling resistance and the first tunneling resistance is on the order of 10e7.

20. The method of claim 11 wherein the resistive memory is associated with a plurality of tunneling resistances, and wherein the first tunneling resistance is within the plurality of tunneling resistances.

21. A method for a crossbar memory array having a first plurality of metallic electrodes, a second plurality of electrodes, and a plurality of resistive memory devices electrically disposed between the first plurality of metallic electrodes and the second plurality of electrodes, the method comprising:
applying with a control circuit a voltage to a gate of a first transistor;
coupling a source of the first transistor to a drain of the first transistor in response to the voltage applied to the gate to thereby cause an erase voltage to be applied across a first metallic electrode from the first plurality of metallic electrodes, a second electrode from the second plurality of electrodes, and a resistive memory device from the plurality of resistive memory devices, wherein the resistive memory device comprises a layer of resistive switching material having a first surface contacting the first metallic electrode, and a second surface contacting the second electrode; and
inducing metal particles from a plurality of metallic particles derived from the first metallic electrode that are trapped within a plurality of defect sites within the layer of resistive switching material to migrate towards the first metallic electrode in response to the erase voltage being applied to form a conductive filament within the layer of resistive switching material;
wherein a first tunneling resistance is characterized by a tunneling resistance associated with the conductive filament within the layer of resistive switching material.

22. The method of claim 21 wherein the plurality of metallic particles comprise particles selected from a group consisting of: silver particles, gold particles, nickel particles, aluminum particles, chromium particles.

23. The method of claim 21 wherein the resistive switching material is selected from a group consisting of: amorphous silicon-bearing material, and non-crystalline silicon.

24. The method of claim 21 wherein the second plurality of electrodes comprise a conductive silicon bearing material selected from a group consisting of: a p-type doped polycrystalline silicon-bearing material and a p-type polysilicon.

25. The method of claim 21 further comprising:
applying a read voltage across the first metallic electrode, the second electrode, and the resistive memory device to thereby induce a current flow through the resistive memory device, wherein the current flow is also in response the first tunneling resistance; and wherein the metallic particles from the plurality of metallic particles trapped in the plurality of defect sites within the layer of resistive switching material remain trapped while the read voltage is applied across the first metallic electrode, the resistive memory device, and the second electrode.

26. The method of claim 25 wherein the current flow is within a range of about 10e-7 amps to about 10e-9 amps.

* * * * *